(12) United States Patent
Liu et al.

(10) Patent No.: US 9,812,514 B2
(45) Date of Patent: Nov. 7, 2017

(54) ANNULAR DISPLAY DEVICE AND FABRICATION METHOD THEREOF

(71) Applicants: HannStar Display (Nanjing) Corporation, Nanjing (CN); HannStar Display Corporation, Taipei (TW)

(72) Inventors: Chun-Pin Liu, Taipei (TW); Chin-Wei Lin, Tainan (TW)

(73) Assignees: HannStar Display (Nanjing) Corporation, Nanjing (CN); HannStar Display Corporation, Taipei (TW)

( * ) Notice: Subject to any disclaimer, the term of this patent is extended or adjusted under 35 U.S.C. 154(b) by 0 days.

(21) Appl. No.: 15/150,441

(22) Filed: May 10, 2016

(65) Prior Publication Data

US 2017/0194383 A1    Jul. 6, 2017

(30) Foreign Application Priority Data

Dec. 30, 2015    (CN) .......................... 2015 1 1023850

(51) Int. Cl.
| | |
|---|---|
| *H01L 29/08* | (2006.01) |
| *H01L 27/32* | (2006.01) |
| *H01L 51/00* | (2006.01) |
| *H01L 51/52* | (2006.01) |

(52) U.S. Cl.
CPC ........ *H01L 27/323* (2013.01); *H01L 51/0097* (2013.01); *H01L 51/5246* (2013.01); *H01L 51/5253* (2013.01); *H01L 51/5293* (2013.01); *H01L 27/3244* (2013.01); *H01L 51/5256* (2013.01); *H01L 2227/323* (2013.01)

(58) Field of Classification Search
CPC ............... H01L 27/323; H01L 51/0097; H01L 51/5293; H01L 51/5253; H01L 51/5246; H01L 2251/5338; H01L 2221/558
USPC ........ 257/40, 72, E51.001, E29.007; 438/82, 438/99
See application file for complete search history.

(56) References Cited

U.S. PATENT DOCUMENTS

| | | |
|---|---|---|
| 2014/0362019 A1 | 12/2014 | Eom et al. |
| 2016/0209875 A1* | 7/2016 | Kim ...................... G06F 1/1652 |

* cited by examiner

*Primary Examiner* — Thinh T Nguyen
(74) *Attorney, Agent, or Firm* — CKC & Partners Co., Ltd.

(57) ABSTRACT

An annular display device includes a display module, a touch module and a flexible circuit board. The display module includes a first flexible substrate, a thin film transistor element layer and an organic light emitting layer. The touch module includes a second flexible substrate and a touch sensing layer. In the method for fabricating the annular display device, the display module and the touch module are first provided, and then the touch module is disposed on the display module. Then, the flexible circuit board is electrically connected to one of the display module and the touch module. Thereafter, the display module and the touch module are bent to enable each of the first flexible substrate and the second flexible substrate to have a ring shape. Then, the flexible circuit board is electrically connected to one of the display module and the touch module.

18 Claims, 19 Drawing Sheets

900 providing the display module —910 providing the touch module —920 disposing the touch control module on the display module by using the adhesive —930 disposing the polarization layer on the touch module —940 disposing the protection layer on the polarization layer by using the adhesive —950 electrically connecting a sub flexible circuit board with the display module —960 electrically connecting another sub flexible circuit board with the touch module —970 bending the display module and the touch module —980 electrically connecting the sub flexible circuit boards with each other —990

FIG. 9

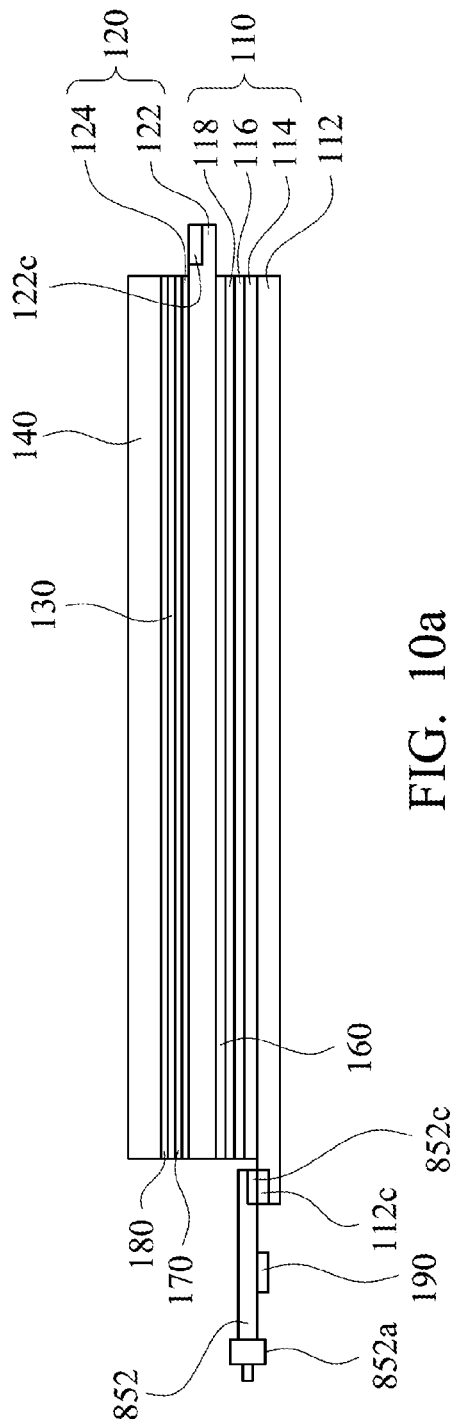
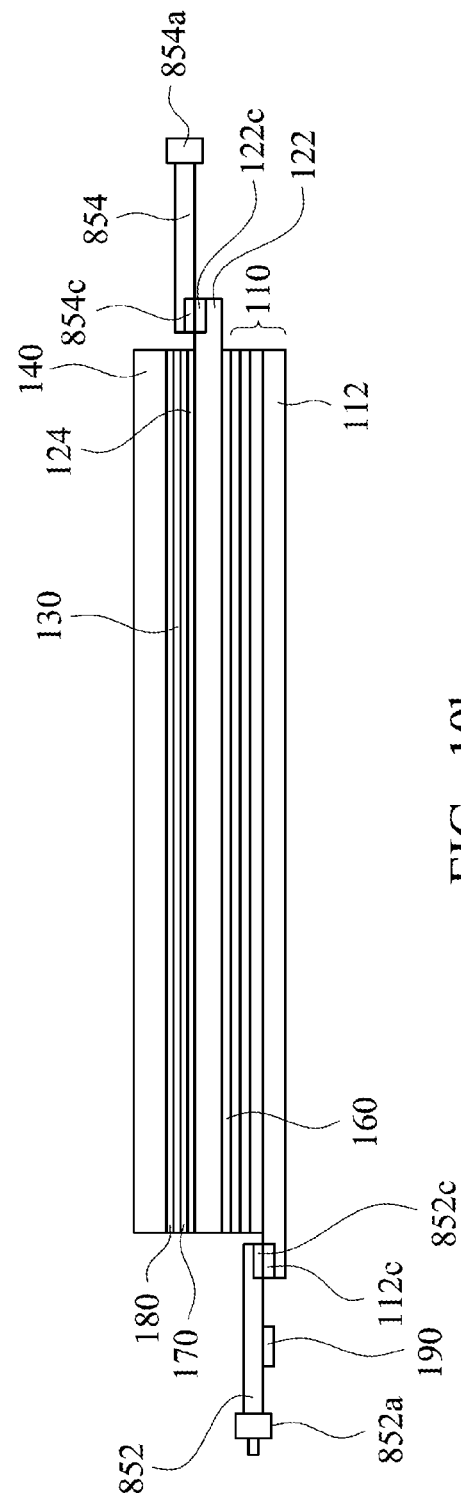
FIG. 10a
FIG. 10b

ANNULAR DISPLAY DEVICE AND FABRICATION METHOD THEREOF

RELATED APPLICATIONS

This application claims priority to China Application Serial Number 201511023850.4, filed Dec. 30, 2015, which is herein incorporated by reference.

BACKGROUND

Field of Invention

The present invention relates to an annular display device and a fabrication method thereof, and more particularly, to an annular display device having a touch function and a fabrication method thereof.

Description of Related Art

Because an organic light-emitting diode (OLED) display has advantages such has self-lighting, wide view angle, rapid response time, low operating voltage, thin panel, the OLED display is generally used in existing annular display devices. For example, most of intelligent watches use the OLED display as a main display. In addition, due to fast development of the touch control technology, a touch module is applied in a flexible electronic device for providing a convenient interface to a user.

However, an annular display device having the OLED display and the touch module needs high fabrication cost. Therefore, there is a need to develop an annular display device and its fabrication method with relatively low fabrication cost.

SUMMARY

One object of the present invention is to provide annular display device and a fabrication method thereof. The annular display device has a lower fabrication cost and simpler fabrication method.

An aspect of the present invention is to provide an annular display device. The annular display device includes a display module, a touch module and a flexible circuit board. The display module includes a first flexible substrate, a thin film transistor element layer and an organic light emitting element layer. The first flexible substrate has a first ring shape. The first ring shape has a first gap portion, in which the first flexible substrate has a first end portion and a second end portion opposite to each other, and the first end portion and the second end portion form the first gap portion. The thin film transistor element layer and the organic light emitting element layer are disposed on the first flexible substrate. The touch module includes a second flexible substrate and a touch sensing layer. The second flexible substrate is disposed on the display module and has a second ring shape. The second ring shape has a second gap portion, in which the second flexible substrate has a third end portion and a fourth end portion opposite to each other, and the third end portion and the fourth end portion form the second gap portion, and the second gap portion corresponds to the first gap portion. The flexible circuit board is electrically connected to the display module and the touch module.

Another aspect of the present invention is to provide a fabrication method of an annular display device. In the fabrication method of the annular display device, at first, a display module is provided. The display module includes a first flexible substrate and a thin film transistor element layer and an organic light emitting element layer disposed on the first flexible substrate. Then, a touch module is provided. The touch module includes a second flexible substrate and a touch sensing layer disposed on the second flexible substrate. Thereafter, the touch module is disposed on the display module. Then, a flexible circuit board is electrically connected to one of the display module and the touch module. Thereafter, the display module and the touch module are bent to enable the first flexible substrate and the second flexible substrate to respectively have a ring shape, wherein the ring shape of the first flexible substrate has a first gap, and the ring shape of the second flexible substrate has a second gap corresponding to the first gap. Then, the flexible circuit board is bent, and the flexible circuit board is electrically connected to the other one of the display module and the touch module.

Further another aspect of the present invention is to provide a fabrication method of an annular display device. In the fabrication method of the annular display device, at first, a display module is provided. The display module includes a first flexible substrate and a thin film transistor element layer and an organic light emitting element layer disposed on the first flexible substrate. Then, a touch module is provided. The touch module includes a second flexible substrate and a touch sensing layer disposed on the second flexible substrate. Thereafter, the touch module is disposed on the display module. Then, a first sub flexible circuit board is electrically connected to the display module. Thereafter, a first sub flexible circuit board is electrically connected to the display module. Then, a second sub flexible circuit board is electrically connected to the touch module. Thereafter, the display module and the touch module are bent to enable the first flexible substrate and the second flexible substrate to respectively have a ring shape, in which the ring shape of the first flexible substrate has a first gap, and the ring shape of the second flexible substrate has a second gap corresponding to the first gap. Then, the first sub flexible circuit board is electrically connected to the second sub flexible circuit board.

It is noted that the annular display device and the fabrication method thereof use only one flexible circuit board to provide electric connections between a driving chip, the display module, and the touch module. Therefore, comparing with conventional annular display devices and fabrication methods thereof, the annular display device of the present invention has decreased fabrication cost and the fabrication method of the annular display device of the present invention can be simpler.

BRIEF DESCRIPTION OF THE DRAWINGS

The invention can be more fully understood by reading the following detailed description of the embodiment, with reference made to the accompanying drawings as follows:

FIG. 9 is flow chart showing a fabrication method of an annular display device in accordance with an embodiment of the present invention;

FIGS. 10a-10d are side views showing structures corresponding to steps of the fabrication method in accordance with the embodiment of the present invention.

DETAILED DESCRIPTION

Figure 1:
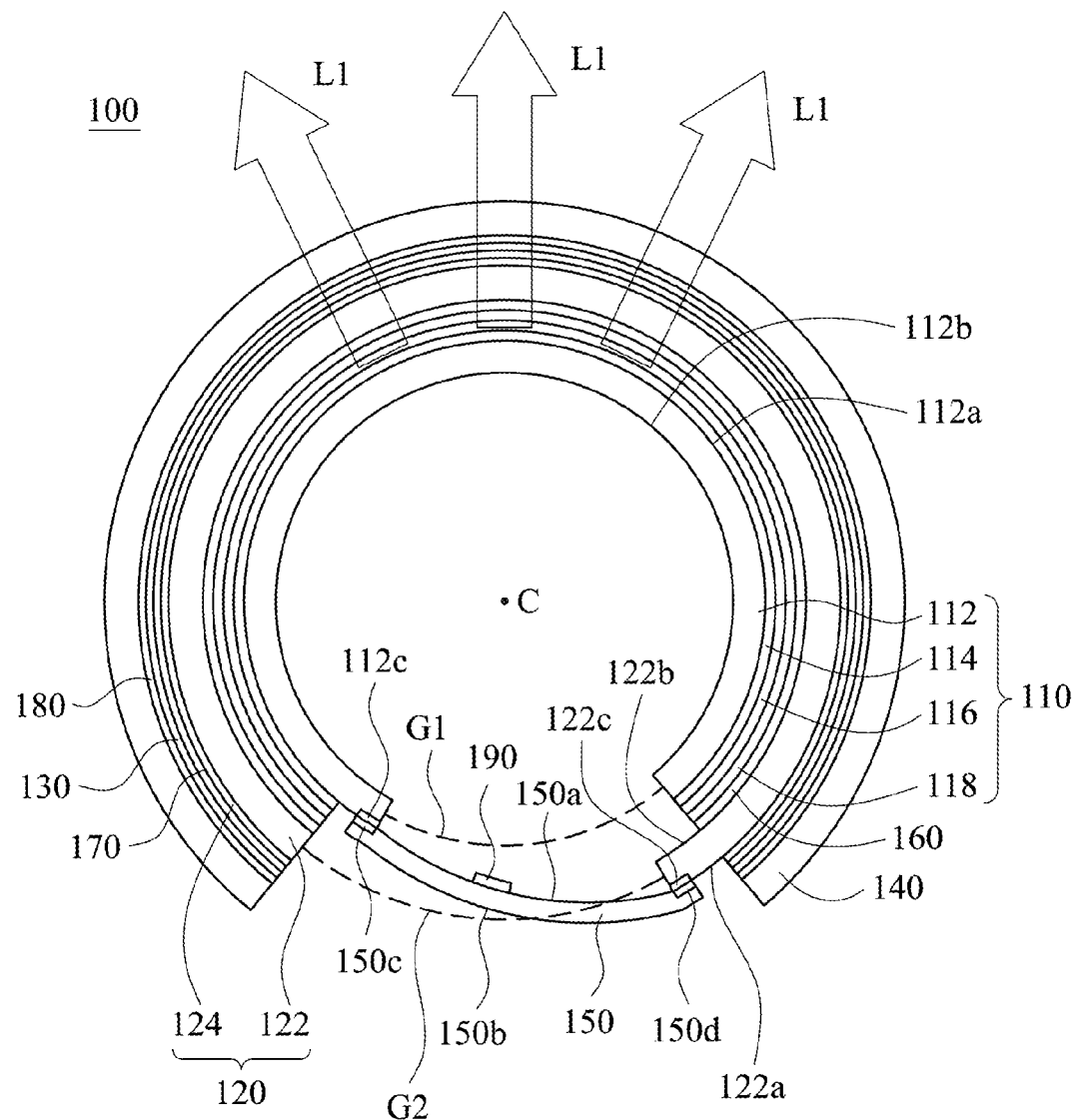
FIG. 1 is a side view showing a structure of an annular display device in accordance with an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Referring to FIG. 1, FIG. 1 is a side view showing a structure of an annular display device 100 in accordance with an embodiment of the present invention. The annular display device 100 includes a display module 110, a touch module 120, a polarization layer 130, a protection layer 140 and a flexible circuit board 150. The display module 110 is used to display images to provide image information to a user. The display module 110 is an active matrix organic light emitting diode (AMOLED) display module including a flexible substrate 112, a thin film transistor (TFT) element layer 114, an organic light emitting element layer 116 and an encapsulation film 118.

The flexible substrate 112 includes a first surface 112a and a second surface 112b opposite to the first surface 112a. The TFT element layer 114, the organic light emitting element layer 116 and the encapsulation film 118 are stacked on the first surface 112a, and a plurality of conductive traces (not shown) and bonding pins 112c are disposed on the first surface 112a. The TFT element layer 114 and the organic light emitting element layer 116 are sequentially disposed on the flexible substrate 112 to provide the image information to the user. The encapsulation film 118 is disposed on the organic light emitting element layer 116 to protect the organic light emitting element layer 116. In this embodiment, the display module 110 is a top emitting type display module, and the organic light emitting element layer 116 emits light L1 toward a direction far away from the flexible substrate 112.

Figure 2:
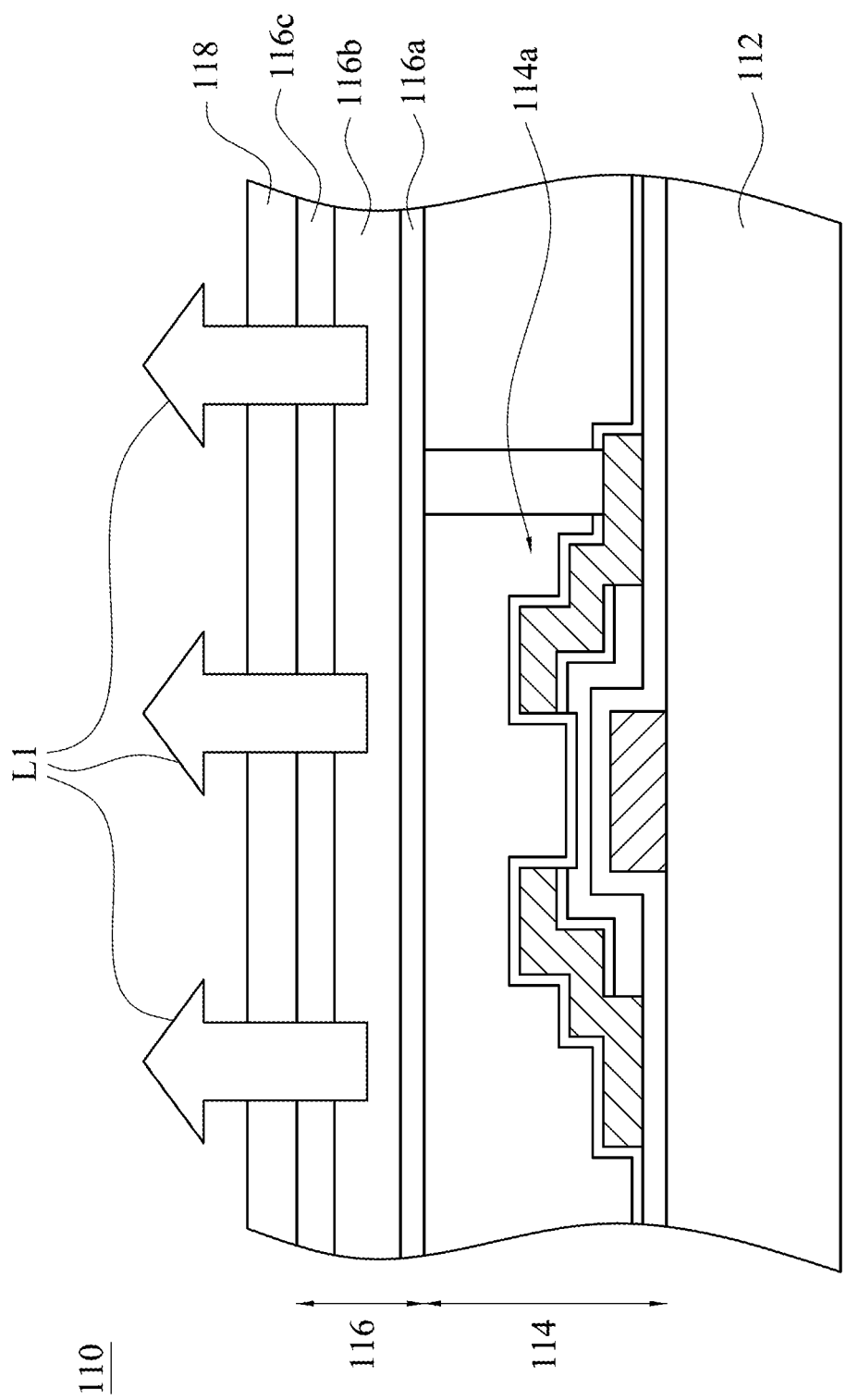
FIG. 2 is a schematic diagram sowing inner structures of a TFT element layer and an organic light emitting element layer in accordance with an embodiment of the present invention.

Thereafter, referring to FIG. 2, FIG. 2 is a schematic diagram showing inner structures of the TFT element layer 114 and the organic light emitting element layer 116 in accordance with an embodiment of the present invention. The display module 110 includes the flexible substrate 112, the TFT element layer 114, the organic light emitting element layer 116 and the encapsulation film 118, in which the TFT element layer 114 includes a TFT 114a, and the organic light emitting element layer 116 includes a first electrode 116a, an organic light emitting layer 116b and a second electrode 116c. The TFT 114a is electrically connected to the first electrode 116a to drive the light emitting element layer 116 to emit light. In this embodiment, since the display module 110 is a top emitting type display module, material of the first electrode 116a includes metal and material of the second electrode 116c includes transparent conductive material to enable the organic light emitting element layer 116 to emit light L1 toward a direction far away from the flexible substrate 112. For example, the material of the first electrode 116a includes aluminum, silver or other material having a high reflectivity, and the material of the second electrode 116c includes indium tin oxide (ITO), indium zinc oxide (IZO), or other conductive and light-penetrable material. However, the materials of the first electrode 116a and the second electrode 116c are not limited thereto.

In addition, since the properties of the organic light emitting layer 116b are susceptible to moisture and oxygen, the encapsulation film 118 is generally formed on the organic light emitting element layer 116, so as to prevent the moisture and oxygen from permeating into the organic lighting layer 116b. The encapsulation film 118 can be a single layer structure or a stacked multi-layer structure. Material of the encapsulation film 118 includes organic materials, inorganic materials, or a combination thereof. It is noted that FIGS. 1 and 2 show that the encapsulation film 118 is disposed on the organic light emitting element layer 116, but embodiments of the present invention are not limited thereto. In other embodiments of the present invention, the display module 110 does not include the encapsulation film 118.

Thereafter, returning to FIG. 1, the touch module 120 is disposed on the display module 110 for being used by the user to control the annular display device 100. The touch module 120 is adhered to the display module 110 through an adhesive 160. The adhesive 160 can be a frame shaped adhesive (double-sided adhesive tape), a film-type adhesive or a liquid-type adhesive. For example, the film-type adhesive can be an optically clear adhesive (OCA) tape, and the liquid-type adhesive can be an optically clear resin (OCR) (commonly referred as Hydrogel). However, embodiments of the present invention are not limited thereto.

The touch module 120 includes a flexible substrate 122 and a touch sensing layer 124. The flexible substrate 122 includes a first surface 122a and a second surface 122b opposite to the first surface 122a. The touch sensing layer 124 is disposed on the first surface 122a of the flexible substrate 122 to sense touch operation of the user, and a plurality of conductive traces (not shown) and bonding pins 122c are disposed on the first surface 122a of the flexible substrate 122. In this embodiment, the touch sensing layer 124 includes a plurality of patterned touch electrodes formed in a single layer structure, but embodiments of the present invention are not limited thereto. In other embodiments of the present invention, the touch sensing layer 124 includes a plurality of patterned touch electrodes formed in a multi-layer structure, in which patterned touch electrodes and insulation layers are stacked on each other to form the touch sensing layer 124. In addition, FIG. 1 shows that the touch sensing layer 124 is disposed on the first surface 122a of the flexible substrate 122, but in other embodiments of the present invention, the touch sensing layer 124 can be disposed on the second surface 122b of the flexible substrate 122, or two touch sensing layers are respectively disposed on the first surface 122a and the second surface 122b.

It is noted that the patterned touch electrode in the touch sensing layer 124 is formed by transparent conductive material or a metal layer having a mesh pattern. For example, the transparent conductive material includes Indium tin oxide (ITO), antimony tin oxide (ATO), fluorine tin oxide (FTO), nanometer metal lines (nanometer silver lines, nanometer copper lines), metal meshes. However, embodiments of the present invention are not limited thereto. In addition, the touch sensing layer 124 includes an overcoating layer covering the patterned touch electrodes to prevent the patterned touch electrodes from being damaged.

As shown in FIG. 1, the annular display device 100 has a virtual center point C. Since the touch module 120 is stacked on the display module 110, the flexible substrate 112, the TFT element layer 114, the organic light emitting layer 116, the encapsulation film 118, the adhesive 160, the flexible substrate 122 and the touch sensing layer 124 are sequentially located in order outward from the virtual center point C of the annular display device 100.

Since it is necessary to bend the flexible substrate 112 and the flexible substrate 122 into a ring shape structure, material of the flexible substrate 112 and the flexible substrate 122 has a characteristic of being bendable. The material of the flexible substrate 112 and the flexible substrate 122 can be polyethylene terephthalate (PET), polyethersulfone (PES), polysulfone (PSF), polycarbonate (PC), polyimide (PI), cyclo olefin polymer (COP), but embodiments of the present invention are not limited thereto.

In addition, in this embodiment, since the first electrode 116a of the organic light emitting element layer 116 is a metal having a characteristic of high reflectivity (for example, aluminum or silver), background light of an external environment is reflected by the first electrode 116a when the background light is emitted into the display module 110, and thus a contrast of the annular display device 100 is reduced. In addition, since the touch module 120 includes a multilayer transparent material, and surfaces of the multilayer transparent material and interfaces between the layers in the multilayer transparent material also reflect the background light, a polarization layer 130 is further disposed on the touch module 120 to touch module improve the image quality of the annular display device 100.

The polarization layer 130 is adhered to the touch module 120 through an adhesive 170. It is noted that, in other embodiments of the present invention, the polarization layer 130 and the adhesive 170 can be integrated into a signal polarization plate. In other words, the signal polarization plate includes the polarization layer 130 and the adhesive 170, and a surface having the adhesive 170 is adhered to the touch module 120. For example, a polarization layer 130, the adhesive 170 and a release film can be staked to form a polarization plate. When the polarization plate is used for forming the annular display device 100, the release film used for protecting the adhesive 170 is tore from the adhesive 170, and then the surface having the adhesive 170 of the polarization plate is adhered to the touch module 120. Material of the polarization layer 130 can be polyvinyl alcohol (PVA) or other material having a characteristic of light polarization. The adhesive 170 can be a film-type adhesive or a liquid-type adhesive. For example, the film-type adhesive can be an OCA tape, and the liquid-type adhesive can be an OCR, but embodiments of the present invention are not limited thereto. In another embodiment that the polarization layer 130 and the adhesive 170 are integrated into a single polarization plate, material of the adhesive 170 can be a pressure sensitive adhesive (PSA).

In further another embodiment of the present invention, the annular display device 100 does not include the polarization layer 130, or the annular display device 100 includes the polarization layer 130 disposed between the display module 110 and the touch module 120.

In addition, in still another embodiment, the flexible substrate 122 of the touch module 120 has a structure similar to the polarization layer 130. In other words, the flexible substrate 122 has a characteristic of light polarization to omit the polarization layer 130.

In this embodiment, the protection layer 140 is adhered to the polarization layer 130 through an adhesive 180. In the embodiment that the annular display device 100 does not include the polarization layer 130 or in the embodiment that the polarization layer 130 disposed between the display module 110 and the touch module 120, the protection layer 140 is adhered to the display module 120 through the adhesive 180. Similar to the adhesive 160, the adhesive 180 can be a frame shaped adhesive (double-sided adhesive), a film-type adhesive or a liquid-type adhesive. For example, the film-type adhesive can be an OCA tape, and the liquid-type adhesive can be an OCR (commonly referred as hydrogel), but embodiments of the present invention are not limited thereto. The protection layer 140 can be a cover lens, and the protection layer 140 has a characteristic of being bendable since it is necessary to bend the protection layer 140. For example, material of the protection layer 140 includes polymethylmethacrylate (PMMA), polycarbonate (PC), PET, COP, cyclic olefin copolymer (COC) or plastic. However, embodiments are not limited thereto.

In addition, In the embodiment that the annular display device 100 does not include the polarization layer 130 or in the embodiment that the polarization layer 130 disposed between the display module 110 and the touch module 120, the protection layer 140 can be a hardened layer directly formed on the touch sensing layer 124 of the touch module 120 to protect the touch sensing layer 124, thereby preventing the touch sensing layer 124 from being damaged by the user or the external environment. Therefore, in the embodiment that the protection layer 140 is a hardened layer a directly formed on the touch sensing layer 124, the adhesive 180 is not required. Material of the hardened layer can be oxide, nitride or carbide, but embodiments of the present invention are not limited thereto.

The flexible circuit board 150 includes a first surface 150a and a second surface 150b opposite to the first surface 150a, in which a plurality of connection points (not shown), conductive traces (not shown) and bonding leads 150c, 150d are disposed on the first surface 150a. A touch with display driver integration (TDDI) chip 190 is disposed on the connection points of the first surface 150a to be electrically connected to the bonding leads 150c, 150d through the conductive traces. The bonding leads 150c, 150d located on opposite sides of the flexible circuit board 150 are electrically connected to the bonding pins 112c of the flexible substrate 112 and the bonding pins 122c of the flexible substrate 122 respectively to enable the TDDI chip 190 to be electrically connected to the display module 110 and the touch module 120, thereby driving and controlling the display module 110 and the touch module 120.

For example, in some embodiments of the present invention, at first, anisotropic conductive film (ACF) or anisotropic conductive paste (ACP) is disposed between the bonding leads 150c and the bonding pins 112c and between the bonding leads 150d and the bonding pins 122c, and then the bonding leads 150c and 150d are pressed, thereby enabling the bonding leads 150c and 150d located on opposite sides of the flexible circuit board 150 to be electrically connected to the connection pins 112c and 122c. However, embodiments of the present invention are not limited thereto.

By electrically connecting the TDDI chip 190 with the display module 110 and the touch module 120, the touch sensing layer 124 generates sensing signals accordingly when the touch operation of the user is sensed by the touch sensing layer 124, and then the sensing signals are transmitted to the TDDI chip 190. The TDDI chip 190 controls the organic light emitting element layer 116 through the TFT element layer 114 to change the image information displayed by the annular display device 100.

In this embodiment, the display module 110 and the touch module 120 are driven by the TDDI chip 190, in which the TDDI chip 190 is a single chip including a touch function and a display driving function, but embodiments of the present invention are not limited thereto. In other embodiments of the present invention, a display driver IC and a touch controller IC are disposed on the flexible circuit board 150 to be electrically connected to the display module 110 and the touch module 120 respectively.

Figure 3:
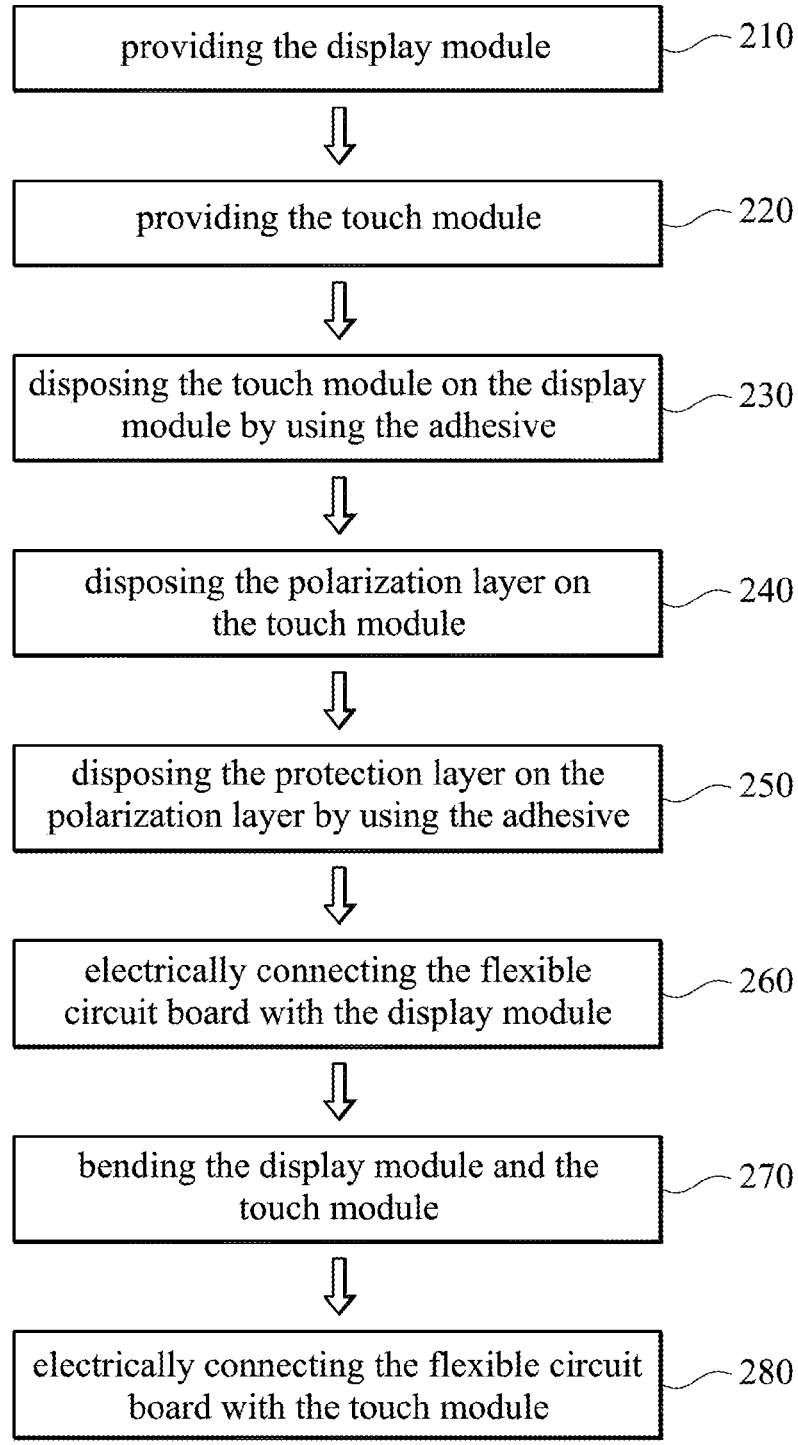
FIG. 3 is flow chart showing a fabrication method of an annular display device in accordance with an embodiment of the present invention.
Figure 4A:
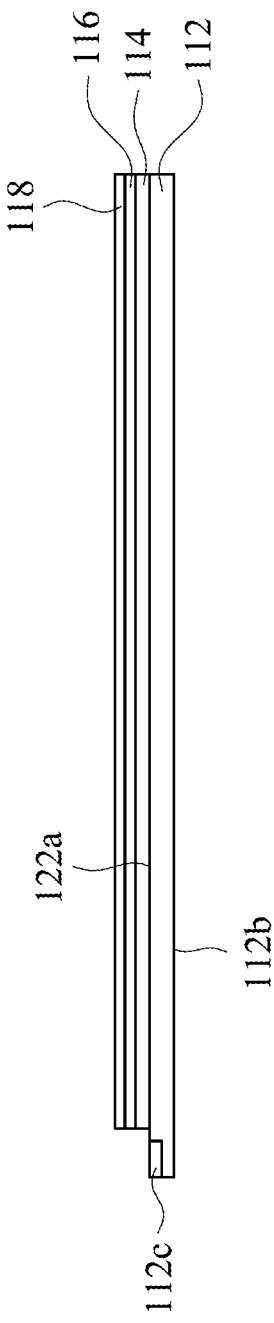
FIGS. 4a-4h are side views showing structures corresponding to steps of the fabrication method in accordance with the embodiment of the present invention.
Figure 4B:
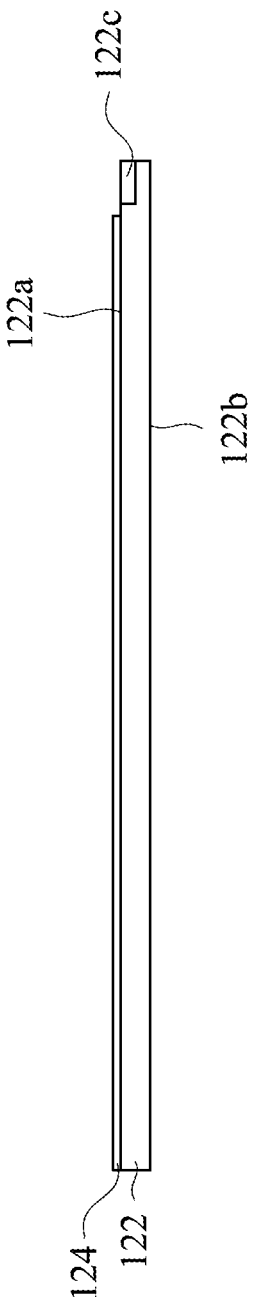
Figure 4C:
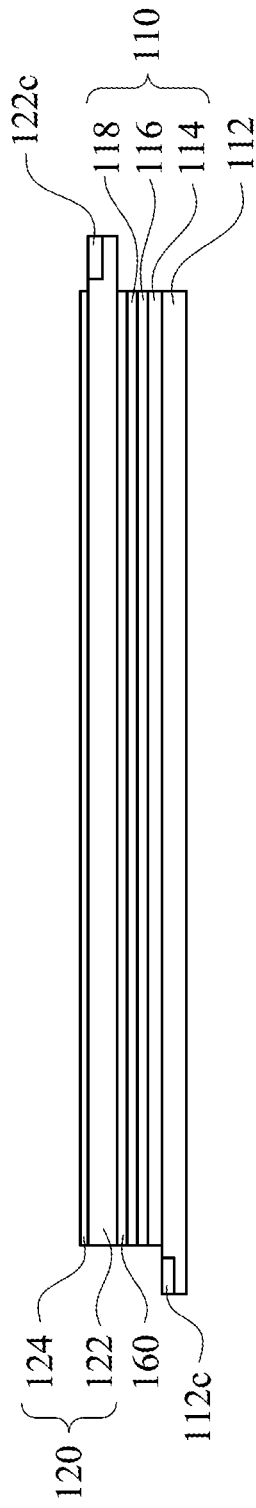

Referring to FIG. 3 and FIGS. 4a-4h, FIG. 3 is flow chart showing a fabrication method 200 of an annular display device in accordance with an embodiment of the present invention, and FIGS. 4a-4h are side views showing structures corresponding to steps 210-280 of the fabrication method 200 in accordance with the embodiment of the present invention. At first, step 210 and step 220 are performed to provide the display module 110 and the touch module 120, as shown in FIGS. 4a-4b. Thereafter, step 230 is performed to dispose the touch module 120 on the display module 110, as shown in FIG. 4c. In this embodiment, the step 230 is performed to use the adhesive 160 to adhere the touch module 120 to the display module 110. For example, double-sided adhesive tapes are used to fix four sides of the touch module 120 on four sides of the display module 110 (also referred to as edge lamination), or a OCA tape or hydrogel is used to completely adhere the touch module 120 to the display module 110 (also referred to as full lamination).

Figure 4D:
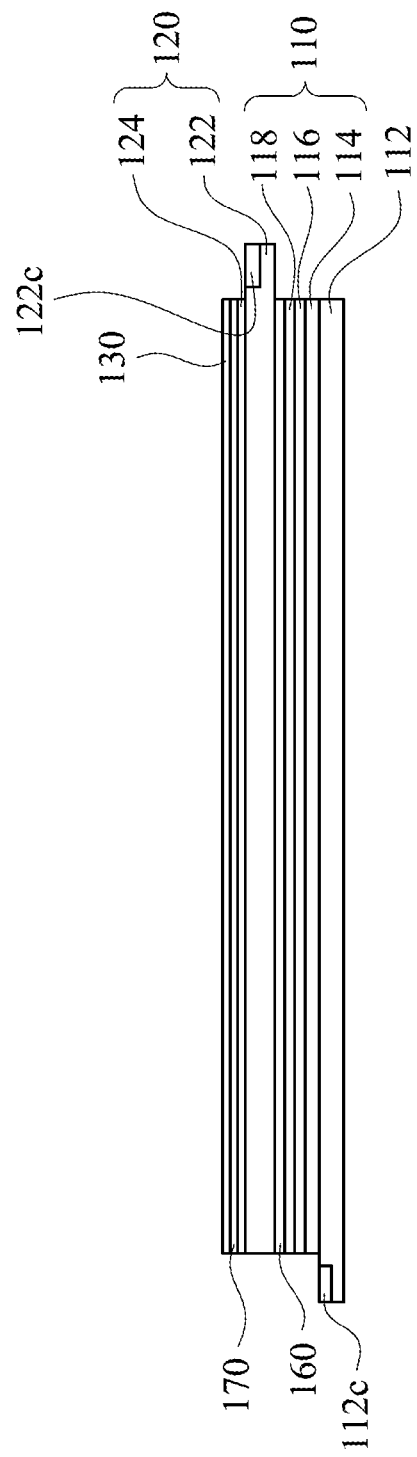
Figure 4E:
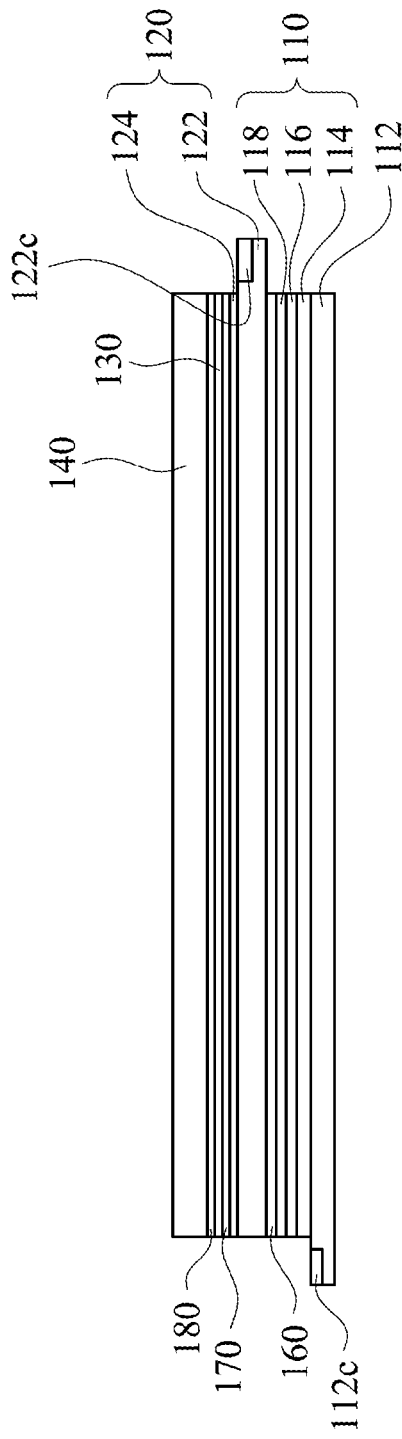
Figure 4F:
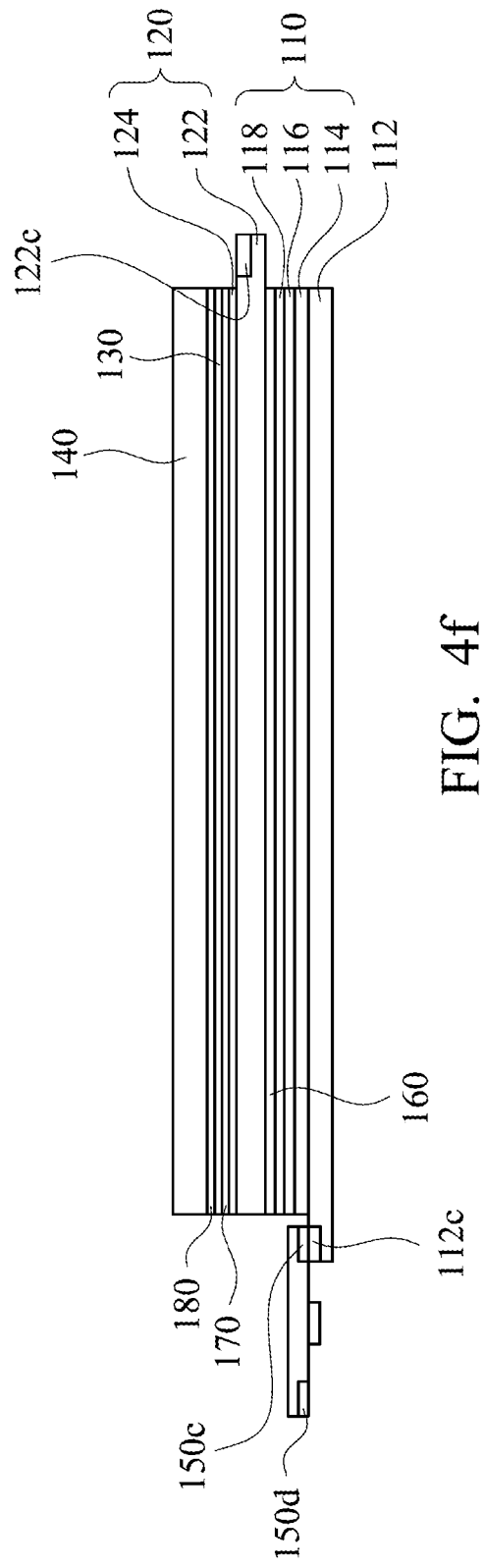

Thereafter, step 240 is performed to dispose the polarization layer 130 on the touch module 120. Step 240 uses the adhesive 170 to attach the polarization layer 130 to the touch module 120, as shown in FIG. 4d. In an embodiment in which the polarization layer 130 and the adhesive 170 are integrated into a single polarization plate, step 240 attached the polarization layer 130 to the touch module 120 by adhering the surface of the polarization plate having the adhesive 170 to the touch module 120. Then, step 250 is performed to dispose the protection layer 140 on the polarization layer 130 to protect the annular display device 100, as shown in FIG. 4e. In this embodiment, step 250 uses the adhesive 180 to adhere the protection layer 140 on the polarization layer 130. For example, similar to the lamination of the display module 110 and the touch module 120, the double-sided adhesive can be used to fix four sides of the protection layer 140 on the four sides of the polarization layer 130, or the OCA tape or hydrogel is used to completely adhere the protection layer 140 on the polarization layer 130. However, embodiments of the present invention are not limited thereto. Thereafter, step 260 is performed to dispose the bonding leads 150c on the flexible substrate 112 of the display module 110 to electrically connect the bonding leads 150c with the bonding pins 112c of the flexible substrate 112, as shown in FIG. 4f.

Figure 4G:
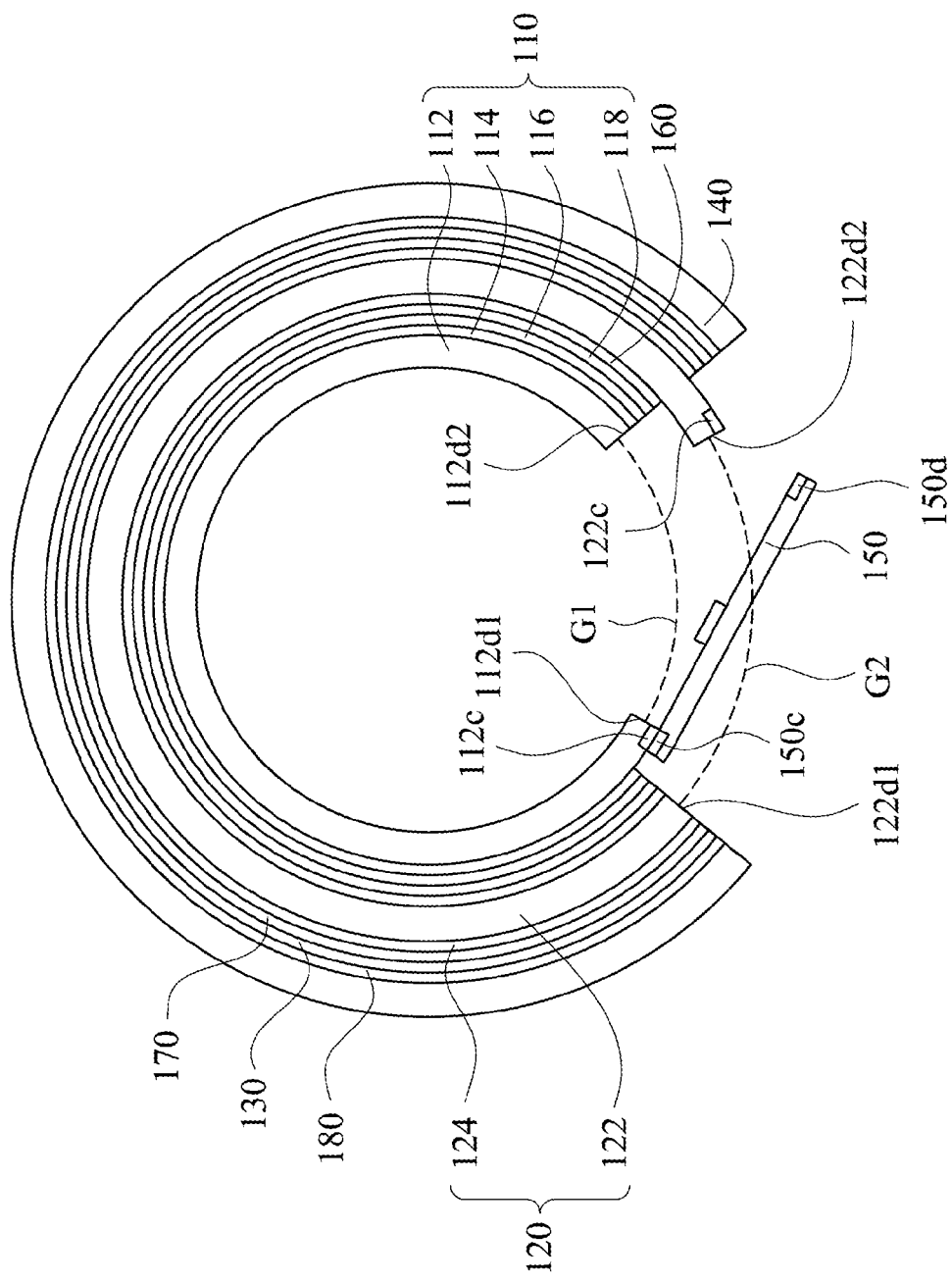

Thereafter, step 270 is performed to bend the display module 110, the touch module 120, the polarization layer 130 and the protection layer 140, as shown in FIG. 4g. In this embodiment, the display module 110, the touch module 120, the polarization layer 130 and the protection layer 140 are respectively bended to form the annular display device having a ring shape. Opposite sides of the flexible substrate 112 of the display module 110 has a first end portion 112d1 and a second end portion 112d2. The flexible substrate 112 of the display module 110 of the annular display device 100 is bent to have a first ring shape. The first ring shape has a first gap portion G1 formed by the first end portion 112d1 and the second end portion 112d2. Opposite sides of the flexible substrate 122 of the touch module 120 has a third end portion 122d1 and a fourth end portion 122d2. The flexible substrate 122 of the touch module 120 of the annular display device 100 is bent to have a second ring shape. The second ring shape has a second gap portion G2 formed by the third end portion 122d1 and the fourth end portion 122d2, in which the second gap portion G2 corresponds to the first gap portion G1.

The protection layer 140 is located in an outer portion of the annular display device 100 to protect the touch module 120. Since the display module 110, the touch module 120, the polarization layer 130 and the protection layer 140 are sequentially stacked, gap portions of the display module 110, the touch module 120, the polarization layer 130 and the protection layer 140 are sequentially stacked after the display module 110, the touch module 120, the polarization layer 130 and the protection layer 140 are bent, thereby forming a gap portion of the annular display device 100. In FIG. 4g, the position of the second gap portion G2 corresponds to the first gap portion G1. In other words, the second gap portion G2 of the touch module 120 is located under the first gap portion G1 of the display module 110. It is noted that the second gap portion G2 of the touch module 120 is considered to be located under the first gap portion G1 of the display module 110 in accordance with the illustration of FIG. 4g. In fact, the relative position between the second gap portion G2 of the touch module 120 and the first gap portion G1 of the display module 110 is determined in accordance with a direction of the annular display device 100. For example, when FIG. 4g is rotated by 180 degrees, the second gap portion G2 of the touch module 120 is located on the first gap portion G1 of the display module 110.

Figure 4H:
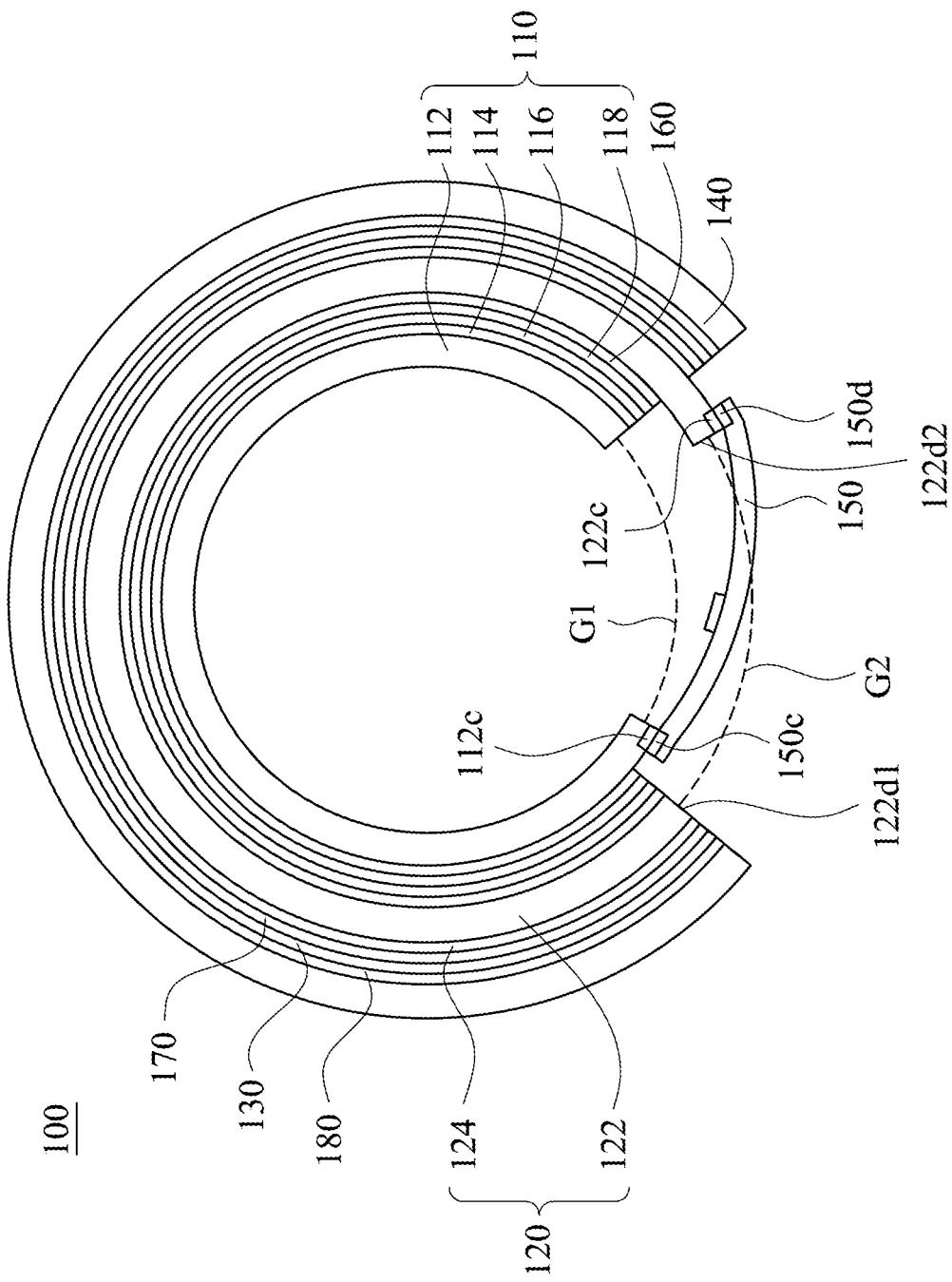

Then, step 280 is performed to electrically connect the bonding leads 150d at another side of the flexible circuit board 150 with the bonding pins 122c of the flexible substrate 122 of the touch module 120, as shown in FIG. 4h, in which the flexible circuit board 150 is electrically connected to the display module 110 and the touch module 120 so as to close the first gap portion G1 of the display module 110 to form the annular display device 100 as shown in FIG. 1. It is noted that, in general, a width of the flexible circuit board 150 is smaller than a width of the first flexible substrate 112 and a width of the second flexible substrate 122, and thus the aforementioned description that "the flexible circuit board 150 is electrically connected to the display module 110 and the touch module 120 so as to close the first gap portion G1" means that the flexible circuit board 150 is used to close the first gap portion G1 in accordance with the FIG. 1 which is a schematic side view showing the first flexible substrate 112, the second flexible substrate 122 and the flexible circuit board 150.

It is specially noted that, in the fabrication method of the annular display device of the present invention, it is not necessary to perform steps 210-290 in the order shown in FIG. 3. For example, step 260 can be performed between step 210 and step 230. In other words, before step 230 performed to dispose the touch module 120 on the display module 110, the bonding leads 150c of the flexible circuit board 150 are disposed on the flexible substrate 112 of the display module 110 to electrically connect the bonding leads 150c to the bonding pins 112c of the flexible substrate 112.

In addition, in this embodiment, as shown in FIGS. 4a and 4b, the bonding pins 112c are located at a left side of the flexible substrate 112 in FIG. 4a, and the bonding pins 122c are located at a right side of the flexible substrate 122 in FIG. 4b. Thereafter, referring to FIGS. 4c-4e, after steps 230-250 performed to attach the touch module 120 to the display module 110, to attach the polarization layer 130 to the touch module 120, and to attach the protection layer 140 to the polarization layer 130, the flexible substrate 122 of the touch module 120, the polarization layer 130 and the protection layer 140 do not cover the bonding pins 112c of the flexible substrate 112. In other words, when the flexible substrate 122, the polarization layer 130 and the protection layer 140 are projected on the flexible substrate 112, the projections of the flexible substrate 122, the polarization layer 130 and the protection layer 140 do not overlap the bonding pins 112c for convenience of step 260 performed to dispose the bonding leads 150c of the flexible circuit board 150 on the flexible substrate 112 of the display module 110, so as to electrically connect the bonding leads 150c with the bonding pins 112c of the flexible substrate 112, as shown in FIG. 4f. In addition, the protection layer 140 and the polarization layer 130 do not cover the bonding pins 122c of the flexible substrate 122 of the touch module 120. In other words, when the protection layer 140 and the polarization layer 130 are projected on the flexible substrate 122, the projections of the protection layer 140 and the polarization layer 130 do not overlap the connection pins 122c for convenience of step 280 performed to dispose the bonding leads 150d of the flexible circuit board 150 on the flexible substrate 122 of the touch module 120, so as to electrically connect the bonding leads 150d with the bonding pins 122c of the flexible substrate 122.

In addition, in FIG. 1, the flexible substrate 122 of the touch module 120, the polarization layer 130 and the protection layer 140 do not cover the bonding pins 112c of the flexible substrate 112, and the protection layer 140 and the polarization layer 130 do not cover the bonding pins 122c of the flexible substrate 122. However, embodiments of the present invention are not limited thereto. In other embodiments of the present invention, in a condition that steps 260 and 280 are not influenced, the flexible substrate 122 of the touch module 120, the polarization layer 130 and the protection layer 140 can cover the bonding pins 112c of the flexible substrate 112, and the protection layer 140 and the polarization layer 130 can cover the bonding pins 122c of the flexible substrate 122.

It is noted that, in this embodiment, at first, the flexible circuit board 150 is electrically connected to the display module 110, and then the display module 110, the touch module 120, the polarization layer 130 and the protection layer 140 are bent, and then the flexible circuit board 150 is electrically connected to the touch module 120. However, in other embodiments of the present invention, at first, the flexible circuit board 150 is electrically connected to the touch module 120, and then the display module 110, the touch module 120, the polarization layer 130 and the protection layer 140 are bent, and then the flexible circuit board 150 is electrically connected to the display module 110.

In addition, in this embodiment, the bonding pins 112c of the display module 110 are located at a left side of the flexible substrate 112, and the bonding pins 122c of the touch module 120 are located at a right side of the flexible substrate 122 for convenience of electric connection between the flexible circuit board 150 and the display module 110 and between the flexible circuit board 150 and the touch module 120 (see FIGS. 4e-4h). In other embodiments of the present invention, the bonding pins 112c of the display module 110 are located at a right side of the flexible substrate 112, and the bonding pins 122c of the touch module 120 are located at a left side of the flexible substrate 122 for the same purpose of electric connection between the flexible circuit board 150 and the display module 110 and between the flexible circuit board 150 and the touch module 120.

Figure 5A:
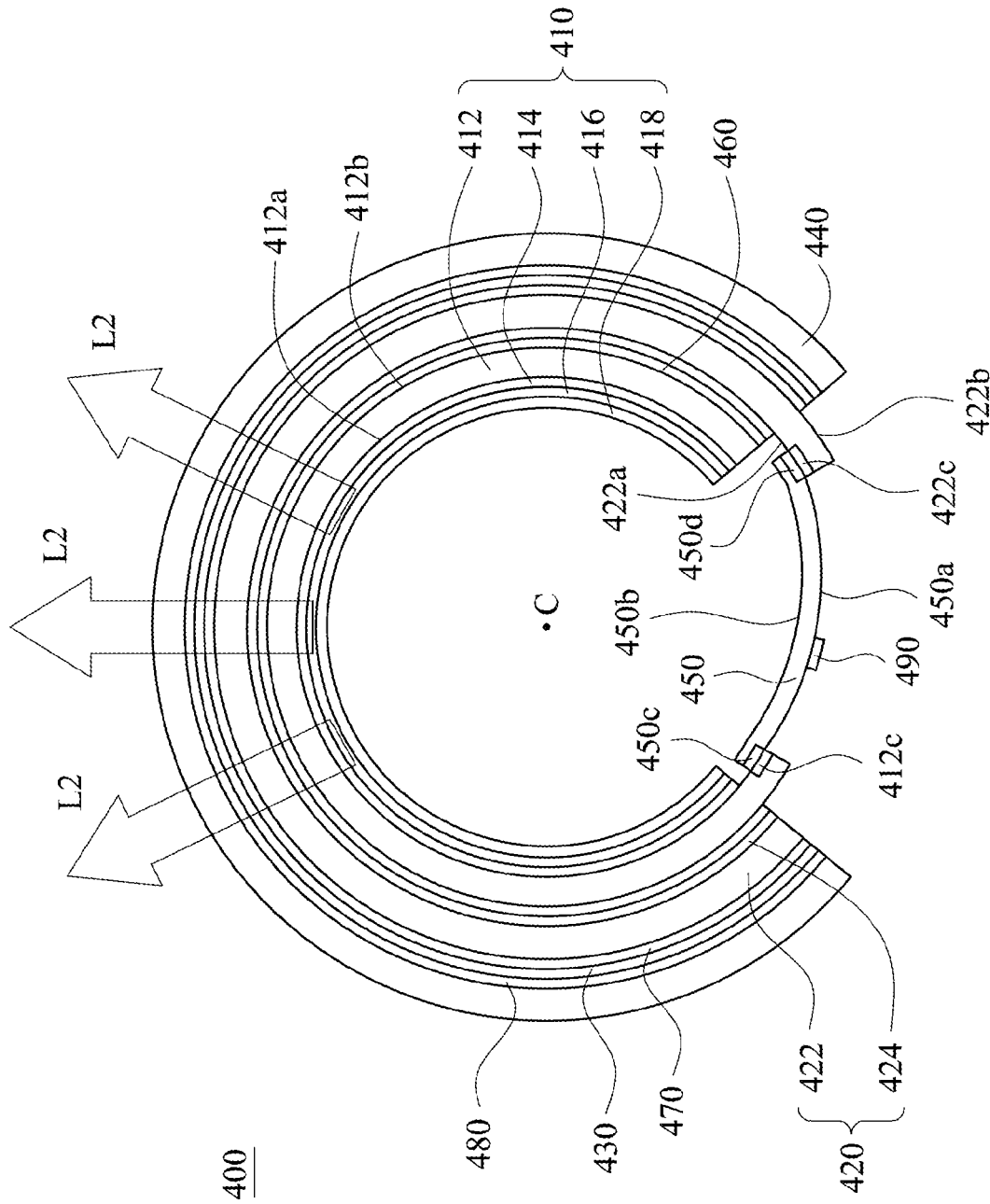
FIG. 5a is a side view showing a structure of an annular display device in accordance with another embodiment of the present invention.
Figure 5B:
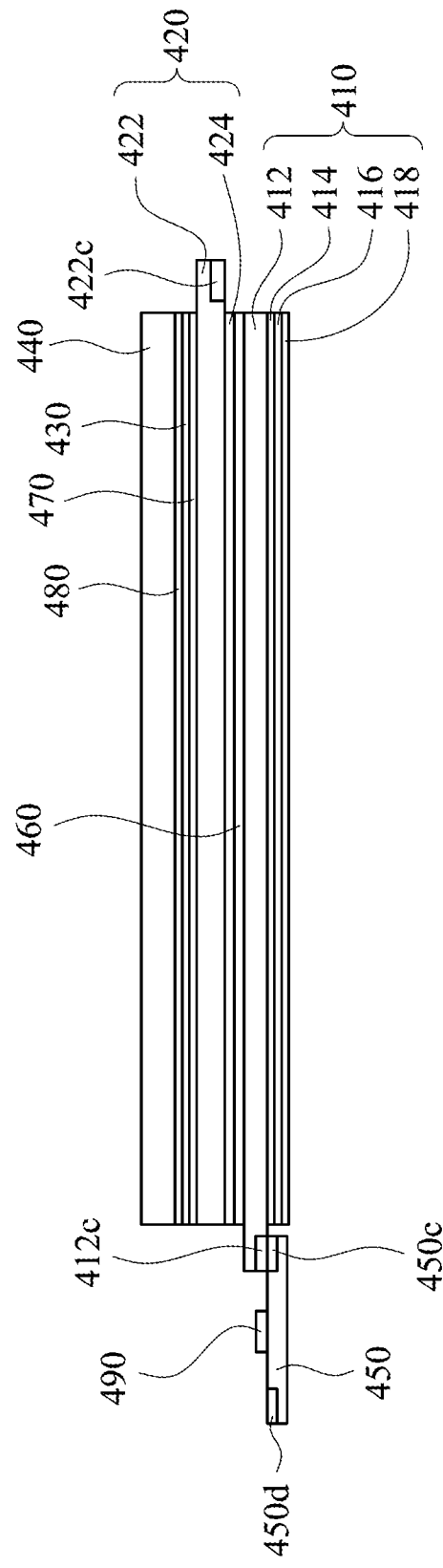
FIG. 5b is a side view showing a structure of the annular display device before being bent in accordance with an embodiment of the present invention.

Thereafter, referring to FIGS. 5a and 5b, FIG. 5a is a side view showing a structure of an annular display device 400 in accordance with another embodiment of the present invention, and FIG. 5b is a side view showing a structure of the annular display device 400 before being bent in accordance with an embodiment of the present invention. The annular display device 400 includes a display module 410, a touch module 420, a polarization layer 430, a protection layer 440 and a flexible circuit board 450. The display module 410 is similar to the display module 110. The display module 410 includes a flexible substrate 412, TFT element layer 414, an organic light emitting element layer 416 and an encapsulation film 418. Differences between the display module 410 and the display module 110 are in that the display module 410 is a bottom emitting type display module, and the organic light emitting element layer 416 emits light L2 toward the flexible substrate 412.

The flexible substrate 412 includes a first surface 412a and a second surface 412b opposite to the first surface 412a. The TFT element layer 414, the organic light emitting element layer 416 and the encapsulation film 418 are stacked on the first surface 412a, and a plurality of conductive traces (not shown) and bonding pins 412c are disposed on the first surface 412a. The TFT element layer 414 and the organic light emitting element layer 416 are sequentially disposed on the first surface 412a of the flexible substrate 412 to provide the image information to the user. The encapsulation film 418 is disposed on the organic light emitting element layer 416 to protect the organic light emitting element layer 416. In this embodiment, the display module 410 is a bottom emitting type display module.

Figure 6:
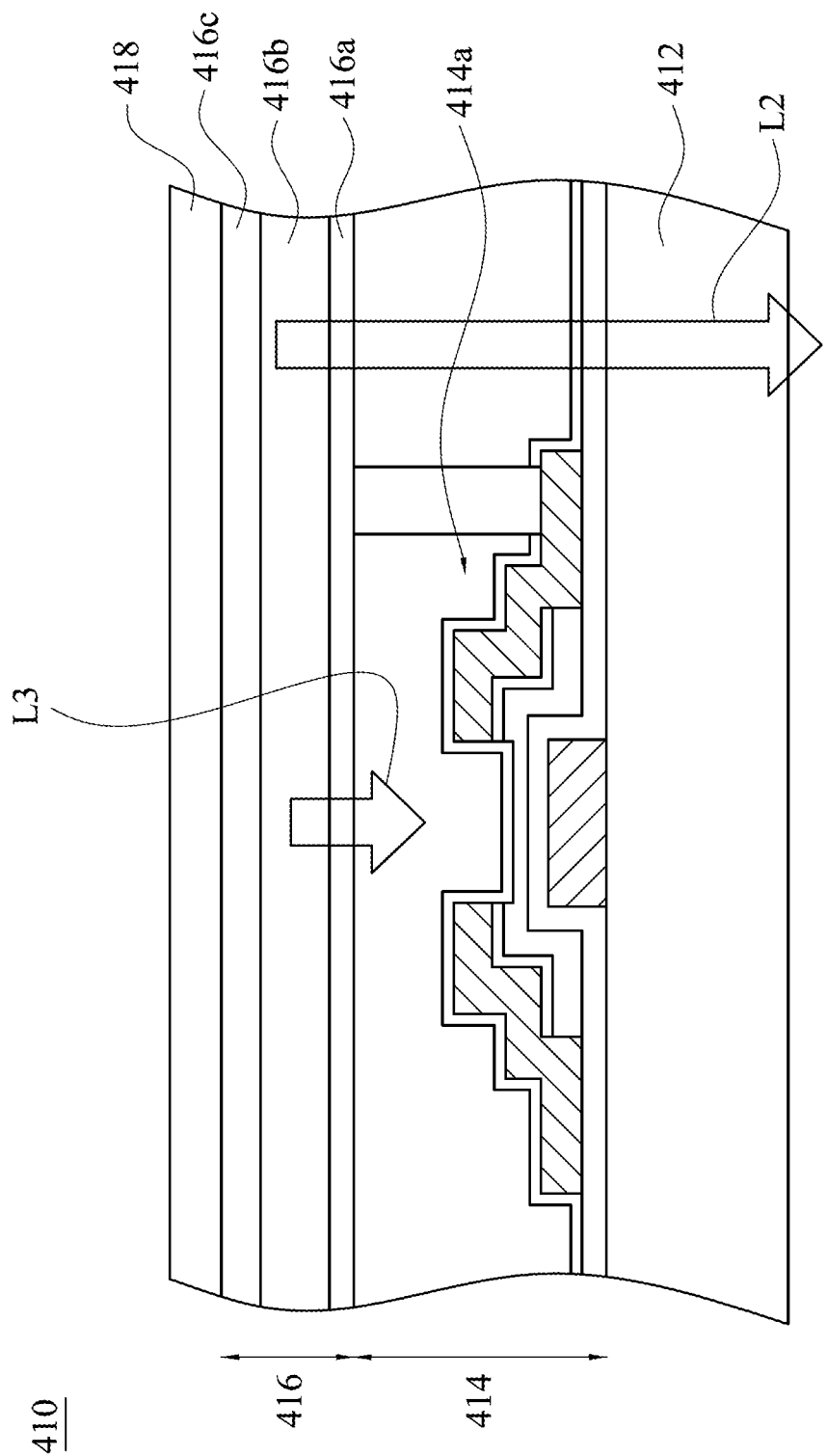
FIG. 6 is a schematic diagram sowing inner structures of the TFT element layer and the organic light emitting element layer in accordance with an embodiment of the present invention.

Thereafter, referring to FIG. 6, FIG. 6 is a schematic diagram sowing inner structures of the TFT element layer 414 and the organic light emitting element layer 416 in accordance with an embodiment of the present invention. The display module 410 includes the flexible substrate 412, the TFT element layer 414, the organic light emitting element layer 416 and the encapsulation film 418, in which the TFT element layer 414 includes a TFT 414a, and the organic light emitting element layer 416 includes a first electrode 416a, an organic light emitting layer 416b and a second electrode 416c. The TFT 414a is electrically connected to the first electrode 416a to drive the light emitting element layer 416 to emit light. In this embodiment, since the display module 410 is a bottom emitting type display module, material of the flexible substrate 412 is light-penetrable, and material of the first electrode 416a includes transparent conductive material, and material of the second electrode 416c includes metal to enable the organic light emitting element layer 416 to emit lights L2 and L3 toward the flexible substrate 412, and the light L2 passes through the light-penetrable flexible substrate 412, while the light L3 is blocked by the TFT 414a. For example, the material of the second electrode 416c includes aluminum, silver or other material having a high reflectivity, and the material of first electrode 416a includes indium tin oxide (ITO), indium zinc oxide (IZO), or other conductive and light-penetrable material. However, the materials of the first electrode 416a and the second electrode 416c are not limited thereto.

In addition, similar to the embodiment shown in FIG. 1, since the properties of the organic light emitting layer 416b are susceptible to moisture and oxygen, the encapsulation film 418 is formed on the organic light emitting element layer 416 generally, so as to prevent the moisture and oxygen from permeating into the organic light emitting layer 416b. The encapsulation film 418 can be a single layer structure or a stacked multi-layer structure. Material of the encapsulation film 418 includes organic materials, inorganic materials, or a combination thereof. It is noted that FIGS. 5a, 5b and 6 show that the encapsulation film 418 is disposed on the organic light emitting element layer 416, but embodiments of the present invention are not limited thereto. In other embodiments of the present invention, the display module 410 does not include the encapsulation film 418.

Thereafter, returning to FIGS. 5a and 5b, the touch module 420 is disposed on the display module 410 for being used by the user to control the annular display device 400. It is specially noted that, a difference between this embodiment and the embodiment in FIG. 1 is in that lights are emitted toward the flexible substrate 412 of the display module 410 and pass through the flexible substrate 412 of the display module 410 since the display module 410 of this embodiment is a bottom emitting type display module. Therefore, the touch module 420 is disposed on the second surface 412b of the flexible substrate 412. The touch module 420 is adhered to the display module 410 through an adhesive 460. The adhesive 460 can be a frame shaped adhesive (double-sided adhesive tape), a film-type adhesive or a liquid-type adhesive. For example, the film-type adhesive can be an optically clear adhesive (OCA) tape, and the liquid-type adhesive can be an optically clear resin (OCR) (commonly referred as Hydrogel). However, embodiments of the present invention are not limited thereto.

The touch module 420 includes a flexible substrate 422 and a touch sensing layer 424. The flexible substrate 422 includes a first surface 422a and a second surface 422b opposite to the first surface 422a. The touch sensing layer 424 is disposed on the first surface 422a on the flexible substrate 422 to sense touch operation of the user, and a plurality of conductive traces (not shown) and bonding pins 422c are disposed on the first surface 422a of the flexible substrate 422. It is specially noted that, in the embodiment in FIG. 1, the second surface 122b of the flexible substrate 122 of the touch module 120 is adhered to the encapsulation film 118 of the display module 110. In other words, the second surface 122b of the flexible substrate 122 of the touch module 120 is opposite to the first surface 112a of the flexible substrate 112 of the display module 110. However, a difference between this embodiment and the embodiment shown in FIG. 1 is that the adhesive 460 is used to adhere the touch sensing layer 424 of the touch module 420 to the second surface 412b of the flexible substrate 412 of the display module 410. In other words, the first surface 422a of the flexible substrate 422 of the touch module 420 is opposite to the second surface 412b of the flexible substrate 412 of the display module 410.

In this embodiment, the touch sensing layer 424 includes a plurality of patterned touch electrodes formed in a single layer structure, but embodiments of the present invention are not limited thereto. In other embodiments of the present invention, the touch sensing layer 424 includes a plurality of patterned touch electrodes formed in a multi-layer structure, in which patterned touch electrodes and insulation layers are stacked on each other to form the touch sensing layer 424. In addition, FIGS. 5a and 5b show that the touch sensing layer 424 is disposed on the first surface 422a of the flexible substrate 422, but in other embodiments of the present invention, the touch sensing layer 424 can be disposed on the second surface 422b of the flexible substrate 422, or two touch sensing layers are respectively disposed on the first surface 422a and the second surface 422b. The touch sensing layer 424 is similar to the aforementioned touch sensing layer 124, and thus material of the touch sensing layer 424 is not described again herein. In addition, the touch sensing layer 424 can include an overcoating layer covering the patterned touch electrodes.

Since it is necessary to bend the flexible substrate 412 and the flexible substrate 422 into a ring shape structure, material of the flexible substrate 412 and the flexible substrate 422 has a characteristic of being bendable, in which material of the flexible substrate 412 and the flexible substrate 422 is not described again herein, since the flexible substrate 412 and the flexible substrate 422 are similar to the aforementioned flexible substrate 112 and flexible substrate 122.

In addition, in this embodiment, the polarization layer 430 is disposed on the touch module 420 to improve the image quality of the annular display device 400. However, embodiments of the present invention are not limited thereto. The polarization layer 430 is adhered to the touch module 420 by using an adhesive 470. Similar to the embodiment in FIG. 1, in other embodiments of the present invention, the polarization layer 430 and the adhesive 470 can be integrated into a signal polarization plate. In other words, the signal polarization plate includes the polarization layer 430 and the adhesive 470, and a surface having the adhesive 470 is adhered to the touch module 420. Material of the polarization layer 430 and the adhesive 470 is not described again herein, since the polarization layer 430 and the adhesive 470 are similar to the aforementioned polarization layer 130 and adhesive 170.

In another embodiment of the present invention, the annular display device 400 does not include the polarization layer 430, or the annular display device 400 includes the polarization layer 430 disposed between the display module 410 and the touch module 420.

In addition, in further another embodiment, the flexible substrate 422 of the touch module 420 has a structure similar to the polarization layer 430. In other words, the flexible substrate 422 has a characteristic of light polarization to omit the polarization layer 430.

In this embodiment, the protection layer 440 is adhered to the polarization layer 430 through an adhesive 480. In the embodiment that the annular display device 400 does not include the polarization layer 430 or in the embodiment that the polarization layer 430 disposed between the display module 410 and the touch module 420, the protection layer 440 is adhered to the display module 420 through the adhesive 480. Similar to the adhesive 460, the adhesive 480 can be a frame shaped adhesive (double-sided adhesive tape), a film-type adhesive or a liquid-type adhesive. For example, the film-type adhesive can be an OCA tape, and the liquid-type adhesive can be an OCR (commonly referred as hydrogel), but embodiments of the present invention are not limited thereto.

The protection layer 440 can be a cover lens, and the protection layer 440 has a characteristic of being bendable since it is necessary to bend the protection layer 440. Material of the protection layer 440 is not described again herein, since the protection layer 440 is similar to the aforementioned the protection layer 140.

Similar to the annular display device 100, the flexible circuit board 450 of the annular display device 400 is electrically connected to the display module 410 and the touch module 420 to drive and control the display module 410 and the touch module 420.

The flexible circuit board 450 includes a first surface 450a and a second surface 450b opposite to the first surface 450a, in which a plurality of connection points, conductive traces (not shown) and bonding leads 450c, 450d are disposed on the first surface 450a. A TDDI chip 490 is disposed on the connection points of the first surface 450a to be electrically connected to the bonding leads 450c, 450d through the conductive traces. The bonding leads 450c, 450d located on opposite sides of the flexible circuit board 450 are electrically connected to the bonding pins 412c of the flexible substrate 412 and the bonding pins 422c of the flexible substrate 422 respectively to enable the TDDI chip 490 to be electrically connected to the display module 410 and the touch module 420, thereby driving and controlling the display module 410 and the touch module 420.

In the annular display device 400, the display module 410 and the touch module 420 are driven by the TDDI chip 490, in which the TDDI chip 490 is a single chip including a touch control function and a display driving function, but embodiments of the present invention are not limited thereto. In other embodiments of the present invention, a display driver IC and a touch controller IC are disposed on the flexible circuit board 450 to be electrically connected to the display module 410 and the touch module 420 respectively.

As aforementioned, a difference between this embodiment and the embodiment in FIG. 1 is in that the touch module 420 of this embodiment is stacked on the display module 410 in a manner that the touch sensing layer 424 is adhered to the second surface of the flexible substrate 412 of the display module 410. In other words, the first surface 422a of the flexible substrate 422 of the touch module 420 is opposite to the second surface 412b of the flexible substrate 412 of the display module 410.

As shown in FIGS. 1 and 5a, in the annular display devices 100 and 400, the flexible circuit boards 150 and 450 which are single-sided circuit boards are used to implement electric connections between the display module 110 and the touch module 120 and between the display module 410 and the touch module 420.

Figure 7A:
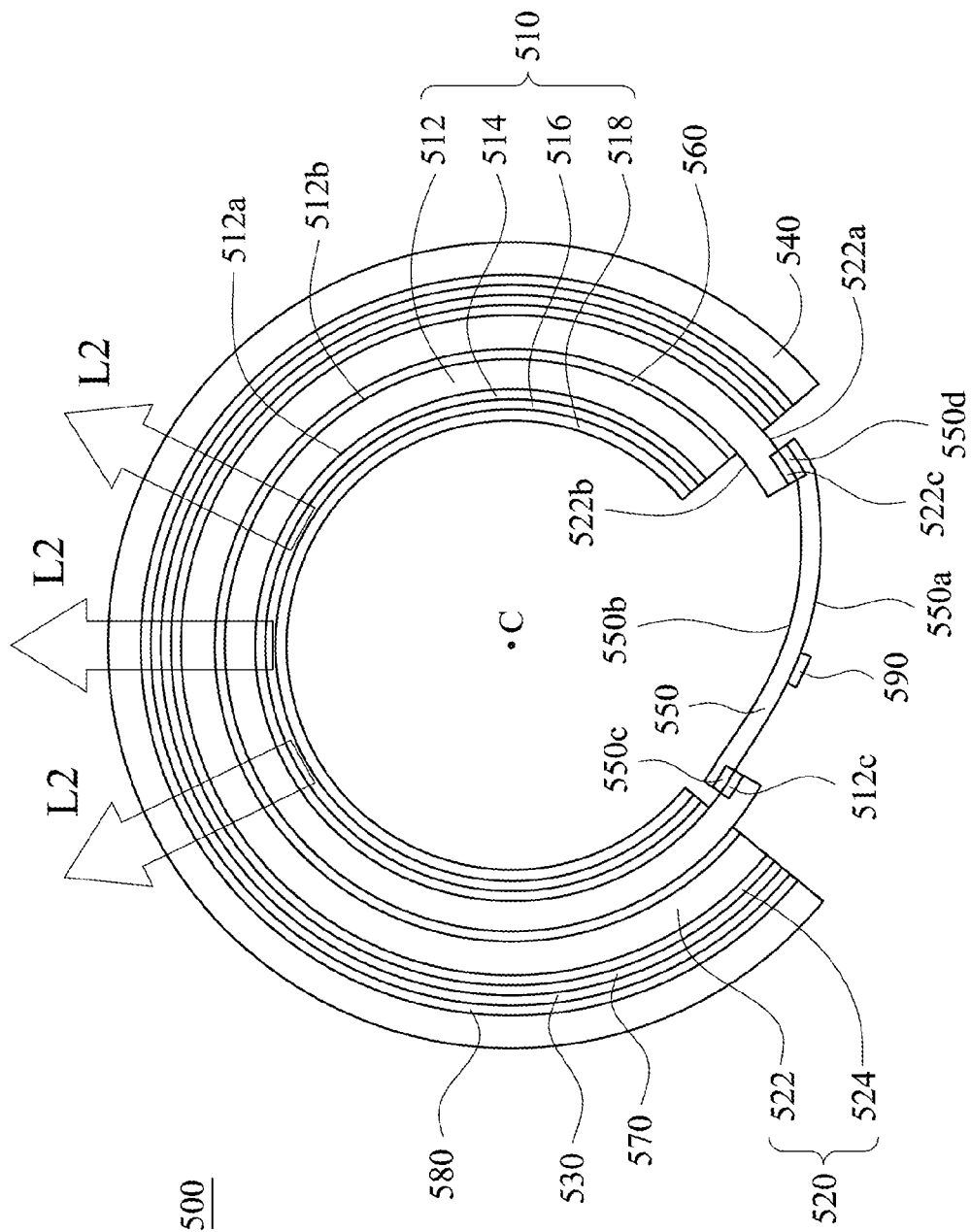
FIG. 7a is a side view showing a structure of an annular display device in accordance with another embodiment of the present invention.
Figure 7B:
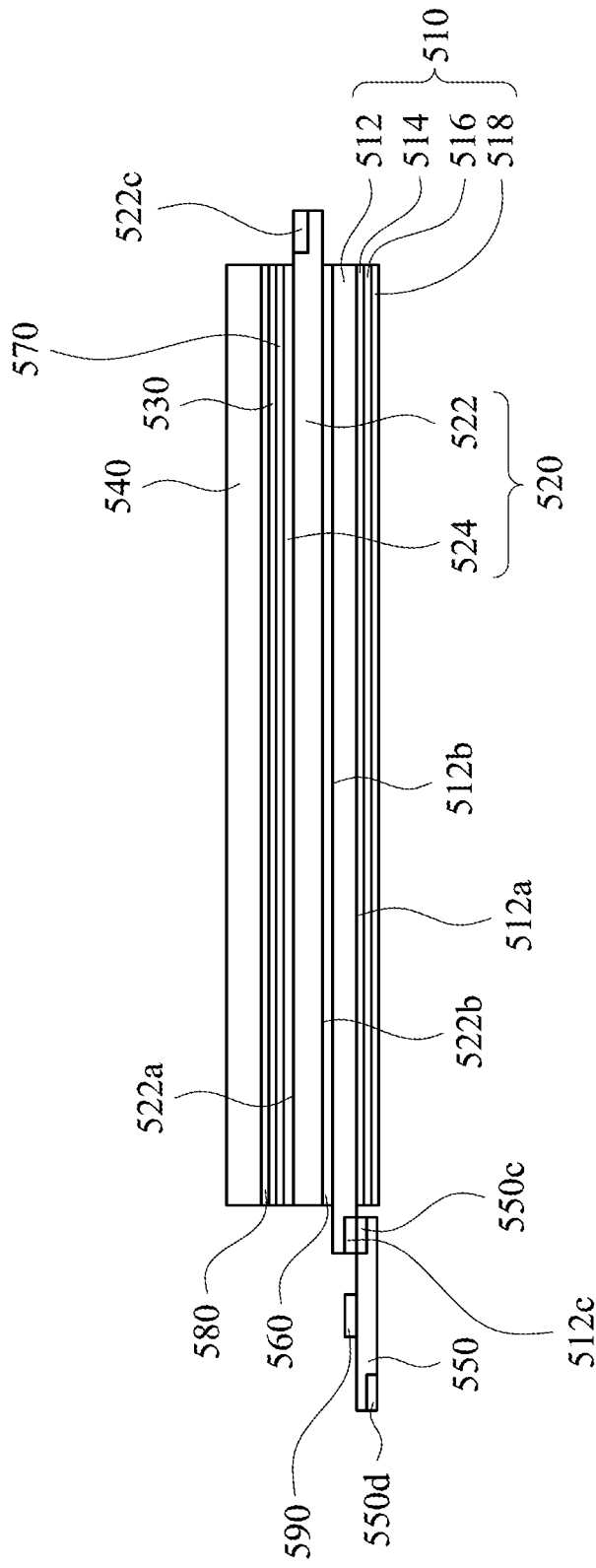
FIG. 7b is a side view showing a structure of the annular display device before being bent in accordance with an embodiment of the present invention.

Thereafter, referring to FIGS. 7a and 7b, FIG. 7a is a side view showing a structure of an annular display device 500 in accordance with another embodiment of the present invention, and FIG. 7b is a side view showing a structure of the annular display device 500 before being bent in accordance with an embodiment of the present invention. The annular display device 500 includes a display module 510, a touch module 520, a polarization layer 530, a protection layer 540 and a flexible circuit board 550. The flexible circuit board 550 includes a first surface 550a and a second surface 550b, and a TDDI chip 590 is disposed on connection points of the first surface 550a of the flexible circuit board 550 to be electrically connected to bonding leads 550c and 550d.

The display module 510 includes a flexible substrate 512, a TFT element layer 514, an organic light emitting element layer 516 and an encapsulation film 518. In this embodiment, the display module 510 is a bottom emitting type display module, and the structure of the display module 510 is similar to the display module 410 in FIG. 6. Therefore, the structure of the display module 510 is not described again herein. The touch module 520 is disposed on the display module 510 through an adhesive 560 for being used by the user to control the annular display device 500. The touch module 520 includes a flexible substrate 522 and a touch sensing layer 524. The touch sensing layer 524 is disposed on a first surface 522a of the flexible substrate 522 to sense the touch operation of the user.

The polarization layer 530 is adhered to the touch module 520 through an adhesive 570, and the protection layer 540 is adhered to the display module 510 through an adhesive 580, in which the adhesives 580, 570 and 560 are similar to the aforementioned adhesives 180, 170 and 160. Therefore, materials of the adhesives 580, 570 and 560 are not described again herein.

As shown in FIGS. 7a and 7b, the TFT element layer 514, the organic light emitting element layer 516 and the encapsulation film 518 are stacked on a first surface 512a of the flexible substrate 512, and the touch module 520 is stacked on the display module 520 in a manner that a second surface 522b of the flexible substrate 522 is adhered to a second surface 512b of the flexible substrate 512 of the display module 510. In other words, the second surface 522b of the flexible substrate 522 of the touch module 520 is opposite to the second surface 512b of the flexible substrate 512 of the display module 510.

Since bonding pins 512c of the flexible substrate 512 and bonding pins 522c of the flexible substrate 522 are respectively formed on the first surface 512a of the flexible substrate 512 and the first surface 522a of the flexible substrate 522, in this embodiment, the flexible circuit board 550 with double-sided circuit is used to implement electric connection between the flexible circuit board 550 and the flexible substrate 512 and between the flexible circuit board 550 and the flexible substrate 522. Specifically, the bonding leads 550c and 550d of the flexible circuit board 550 are respectively formed on the first surface 550a and the second surface 550b opposite to the first surface 550a to be electrically connected to the display module 510 and the touch module 520.

In the annular display device 500, the display module 510 and the touch module 520 are driven by the TDDI chip 590, in which the TDDI chip 590 is a single chip including a touch control function and a display driving function, but embodiments of the present invention are not limited thereto. In other embodiments of the present invention, a display driver IC and a touch controller IC are disposed on the flexible circuit board 550 to be electrically connected to the display module 510 and the touch module 520 respectively.

Figure 8:
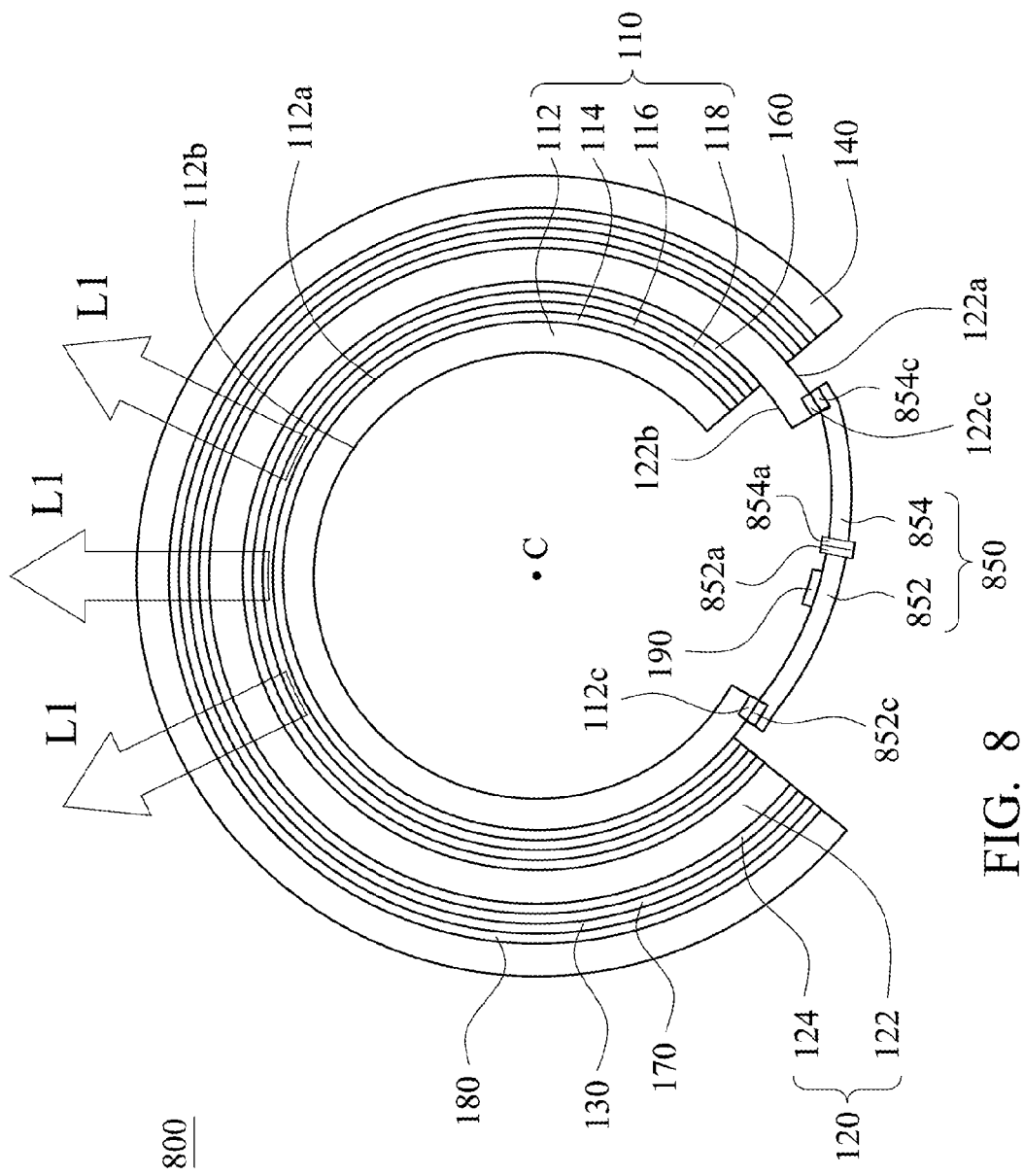
FIG. 8 is a side view showing a structure of an annular display device in accordance with an embodiment of the present invention.

Thereafter, referring to FIG. 8, FIG. 8 is a side view showing a structure of an annular display device 800 in accordance with an embodiment of the present invention. The annular display device 800 is similar to the annular display device 100, but the difference is in that a flexible circuit board 850 is used to replace the flexible circuit board 150. The flexible circuit board 850 includes a first sub flexible circuit board 852 and a second sub flexible circuit board 854, and the first sub flexible circuit board 852 and the second sub flexible circuit board 854 are electrically connected to each other through a connection portion 852*a* of the first sub flexible circuit board 852 and a connection portion 854*a* of the second sub flexible circuit board 854.

In this embodiment, the TDDI chip 190 is disposed on the first sub flexible circuit board 852, but embodiments of the present invention are not limited thereto. In another embodiment of the present invention, the TDDI chip 190 is disposed on the second sub flexible circuit board 854. In further another embodiment of the present invention, a display driver IC and a touch controller IC are used to replace the TDDI chip 190, in which the display driver IC and the touch controller IC are respectively disposed on the first sub flexible circuit board 852 and the second sub flexible circuit board 854 to be electrically connected to the display module 110 and the touch module 120 respectively. In addition, in other embodiments of the present invention, the display driver IC and the touch controller IC are disposed on the first sub flexible circuit board 852, so that the display driver IC is electrically connected to the display module 110, and the touch controller IC is electrically connected to the touch module 120 through the connection portions 852*a*, 854*a* and the second sub flexible circuit board 854, or the display driver IC and the touch controller IC are disposed on the second sub flexible circuit board 854, so that the touch controller IC is electrically connected to touch module 120, and the display driver IC is electrically connected to the display module 110 through the connection portions 852*a*, 854*a* and the first sub flexible circuit board 852.

Referring to FIG. 9 and FIGS. 10*a*-10*d*, FIG. 9 is flow chart showing a fabrication method 900 of an annular display device in accordance with an embodiment of the present invention, and FIGS. 10*a*-10*d* are side views showing structures corresponding to steps 960-990 of the fabrication method 900 in accordance with the embodiment of the present invention. At first, steps 910-950 are performed to dispose the touch module 120 on the display module 110, and to dispose the polarization layer 130 on the touch module 120, and to dispose the protection layer 140 on the polarization layer 130. Steps 910-950 are similar to steps 210-250 of FIG. 3 and FIGS. 4*a*-4*e*, and thus steps 910-950 are not described again herein.

Thereafter, step 960 is performed to dispose bonding leads 852*c* of the first sub flexible circuit board 852 on the flexible substrate 112 of the display module 110 to electrically connect the bonding leads 852*c* with the bonding pins 112*c* of the flexible substrate 112, as shown in FIG. 10*a*. In this embodiment, the first sub flexible circuit board 852 has the connection portion 852*a* used to be electrically connected to the second sub flexible circuit board 854. Then, step 970 is performed to dispose bonding leads 854*c* of the second sub flexible circuit board 854 on the flexible substrate 122 of the touch module 120 to electrically connect the bonding leads 854*c* with the bonding pins 122*c* of the flexible substrate 122, as shown in FIG. 10*b*.

Figure 11:
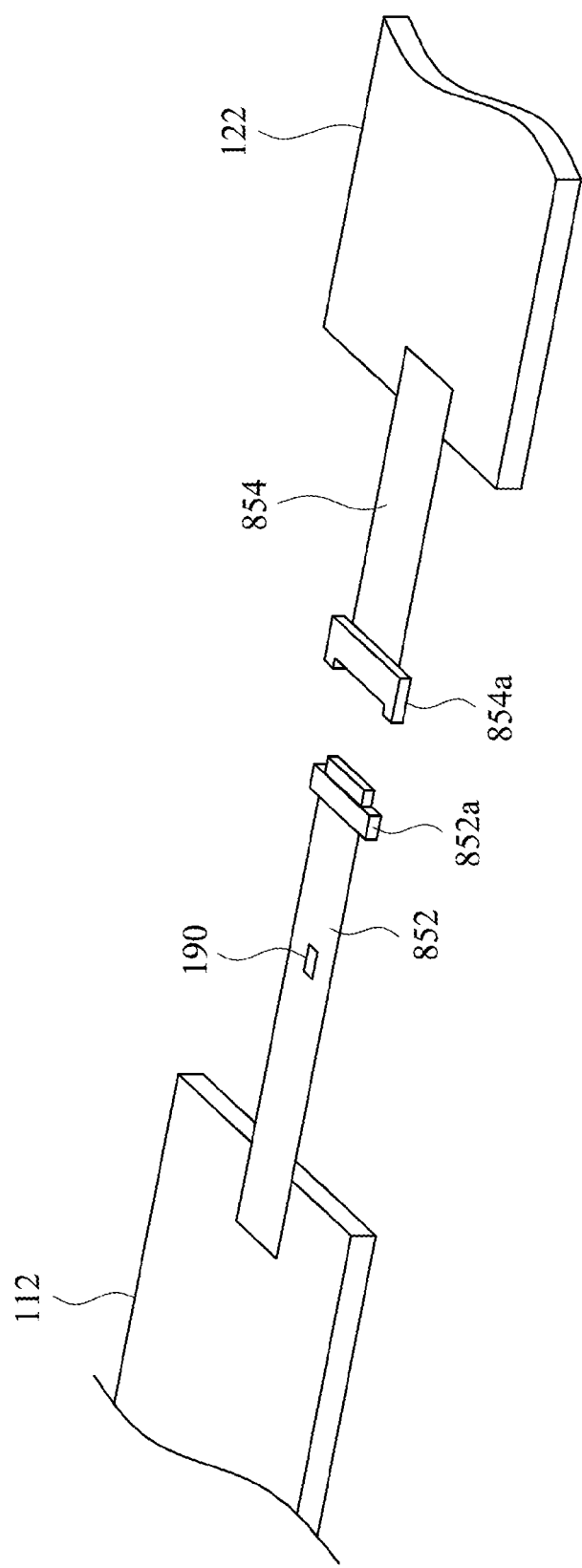
FIG. 11 is a schematic diagram showing structures of sub circuit boards in accordance with the embodiment of the present invention.

In this embodiment, the second sub flexible circuit board 854 has the connection portion 854*a* matching the connection portion 852*a* of the first sub flexible circuit board 852, thereby being electrically connected to the first sub flexible circuit board 852. For example, referring to FIG. 11, the connection portion 852*a* of the first sub flexible circuit board 852 is a plug connector, and the connection portion 854*a* of the second sub flexible circuit board 854 is a socket connector, in which the plug connector matches the socket connector to enable the plug connector to be plugged into the socket connector for electric connection between the first sub flexible circuit board 852 and the second sub flexible circuit board 854. However, the type of the connection portions 852*a*, 854*a* and the connection means between the connection portion 852*a* and 854*a* are not limited thereto. In addition, an order in which steps 960 and 970 are performed is not limited thereto. For example, in other embodiments of the present invention, the bonding leads 854*c* of the second sub flexible circuit board 854 are electrically connected to the bonding pins 122*c* of the flexible substrate 122, and then the bonding leads 852*c* of the first sub flexible circuit board 852 are electrically connected to the bonding pins 112*c* of the flexible substrate 112.

Figure 10C:
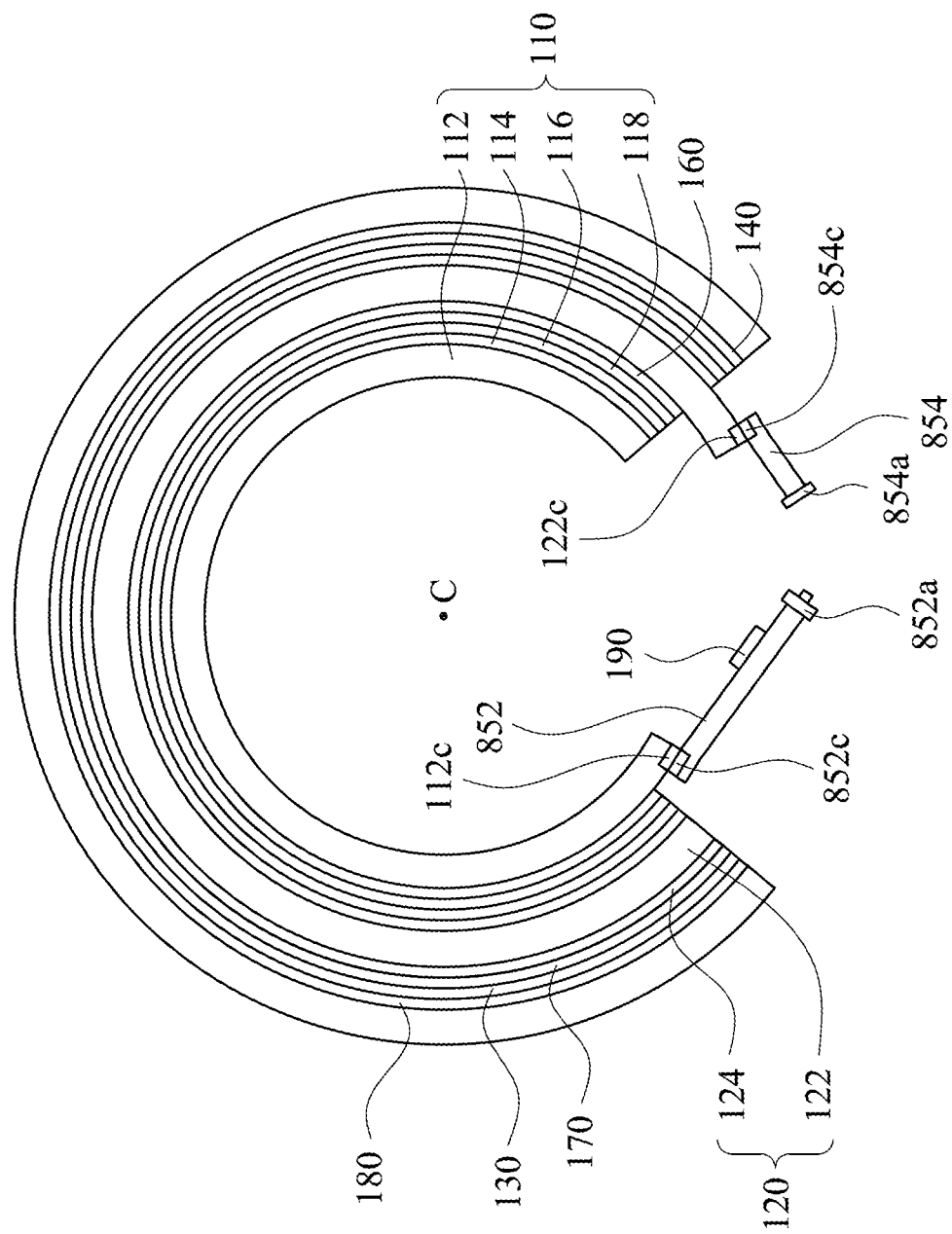
Figure 10D:
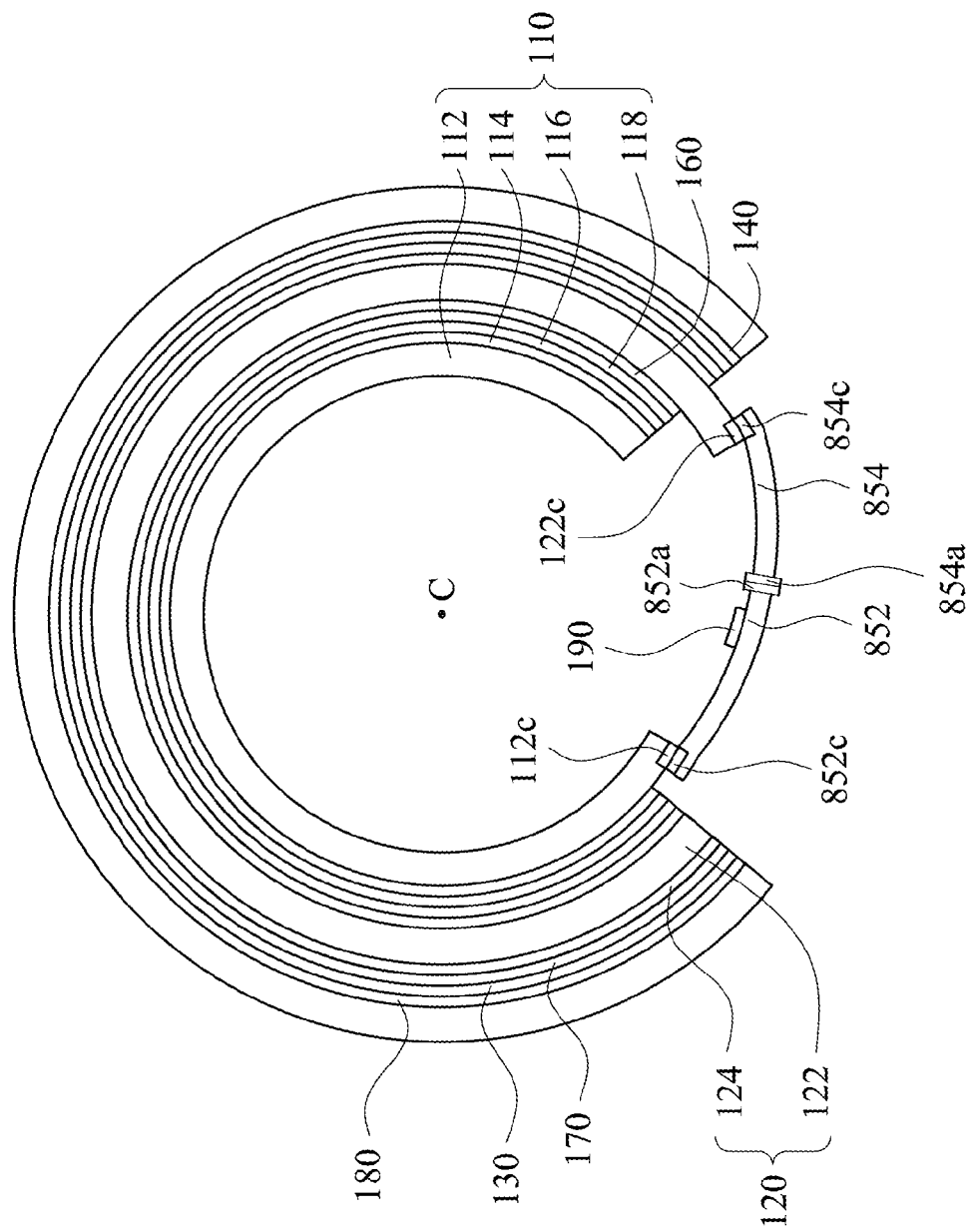

Thereafter, step 980 is performed to bend the display module 110, the touch module 120, the polarization layer 130 and the protection layer 140, as shown in FIG. 10*e*. Step 980 is similar to step 270, and thus details thereof is not described again herein. Then, step 990 is performed to use connection portions 852*a* and 854*a* to connect the first sub flexible circuit board 852 with the second sub flexible circuit board 854 to complete the fabrication of the annular display device 800 as shown in FIG. 10*d*.

In the fabrication method of the present invention, it is not necessary to perform steps 910-990 in the order of the flow chart shown in FIG. 9. For example, step 960 can be performed between steps 910 and 930, and step 970 can be performed between steps 920 and 930. In other words, before step 930 which is performed to connect the display module 110 with the touch module 120, the bonding leads 852*c* of the first sub flexible circuit board 852 are electrically connected to the bonding pins 112*c* of the flexible substrate 112, and the bonding leads 854*c* of the second sub flexible circuit board 854 are electrically connected to the bonding pins 122*c* of the flexible substrate 122.

It is noted that the first sub flexible circuit board 852 and the second sub flexible circuit board 854 are applied in the annular display device of FIG. 1 having a top emitting type display module, but embodiments of the present invention are not limited thereto. In other embodiments, the first sub flexible circuit board 852 and the second sub flexible circuit board 854 can be applied in the annular display devices of FIGS. 5*a*, 5*b*, 6, 7*a* and 7*b* each having a bottom emitting type display module. Details thereof are not described again herein.

It can understood that before the display module 110 and the touch module 120 are not bent, the first sub flexible circuit board 852 and the second sub flexible circuit board 854 are electrically connected to display module 110 and the touch module 120 respectively, thereby benefiting that the annular display device 800 is applied to the field of wearable display devices or the field of interactive information display devices. For example, when being applied to wearable display industries, the annular display device 800 may be configured as a watch or a wrist band. With the annular display device 800, the user may wear the display device formed by steps 910-970 on his or her wrist, and then steps 980-990 are performed to bend the display device to electrically connect the first sub flexible circuit board 852 with the second sub flexible circuit board 854 to form the annular display device 800 sleeved on his or her wrist. When being applied to an interactive information display industry, the annular display device 800 may be configured as an advertisement device (for example, advertisement in a public or outdoor place) or an information providing device (for example, a device for inquiring departure time of buses at a bus stop) sleeving a column (for example, a pillar). When the annular display device 800 is used, the display device formed by steps 910-970 is disposed on the column, and then steps 980-990 are performed to bend the display device to electrically connect the first sub flexible circuit board 852 with the second sub flexible circuit board 854, so as to form the annular display device 800 sleeving the column.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An annular display device, comprising:
    a display module, comprising:
        a first flexible substrate having a first ring shape, the first ring shape having a first gap portion, wherein the first flexible substrate has a first end portion and a second end portion opposite to each other, and the first end portion and the second end portion form the first gap portion; and
        a thin film transistor element layer and an organic light emitting element layer disposed on the first flexible substrate;
    a touch module, comprising:
        a second flexible substrate disposed on the display module and having a second ring shape, the second ring shape having a second gap portion, wherein the second flexible substrate has a third end portion and a fourth end portion opposite to each other, and the third end portion and the fourth end portion form the second gap portion, and the second gap portion corresponds to the first gap portion; and
        a touch sensing layer disposed on the second flexible substrate; and
    a flexible circuit board electrically connected to the display module and the touch module.

2. The annular display device of claim 1, wherein the flexible circuit board comprises:
    a first sub flexible circuit board electrically connected to the display module, wherein the first sub flexible circuit board has a first connection portion; and
    a second sub flexible circuit board electrically connected to the touch module, wherein the second sub flexible circuit board has a second connection portion configured to be electrically connected to the first connection portion.

3. The annular display device of claim 1, further comprising a Touch with Display Driver Integration (TDDI) chip disposed on the flexible circuit board.

4. The annular display device of claim 1, further comprising a display driving chip and a touch controller chip disposed on the flexible circuit board.

5. The annular display device of claim 1, further comprising a protection layer disposed on the touch module.

6. The annular display device of claim 5, further comprising a polarization layer disposed between the touch module and the protection layer.

7. The annular display device of claim 1, wherein the touch sensing layer comprises a plurality of patterned touch electrodes formed in a single layer structure or a multi-layer structure.

8. The annular display device of claim 1, further comprising an adhesive disposed between the display module and the touch module for adhering the display module to the touch module.

9. The annular display device of claim 8, wherein the adhesive is a double-sided adhesive tape, a film-type adhesive or a liquid-type adhesive.

10. The annular display device of claim 1, further comprising an encapsulation film disposed on the organic light emitting element layer.

11. The annular display device of claim 1, wherein the first flexible substrate, the thin film transistor element layer, the organic light emitting element layer, the second flexible substrate and the touch sensing layer are sequentially arranged in order outward from a virtual center point of the annular display device.

12. The annular display device of claim 1, wherein the organic light emitting element layer, the thin film transistor element layer, the first flexible substrate, the touch sensing layer and the second flexible substrate are sequentially arranged in order outward from a virtual center point of the annular display device.

13. The annular display device of claim 1, wherein the organic light emitting element layer, the thin film transistor element layer, the first flexible substrate, the second flexible substrate and the touch sensing layer are sequentially arranged in order outward from a virtual center point of the annular display device.

14. The annular display device of claim 11, wherein the display module is a top emitting type display module.

15. The annular display device of claim 12, wherein the display module is a bottom emitting type display module.

16. The annular display device of claim 11, wherein
    the first flexible substrate comprises a first surface and a second surface opposite to each other, and the second surface faces the virtual center point of the annular display device, and a plurality of first bonding pins are disposed on the first surface;
    the second flexible substrate comprises a third surface and a fourth surface opposite to each other, and the fourth surface faces the virtual center point of the annular display device, and a plurality of second bonding pins are disposed on the third surface; and
    the flexible circuit board comprises a fifth surface and a sixth surface opposite to each other, and the fifth surface faces the virtual center point of the annular display device, and a plurality of first bonding leads and second bonding leads are respectively disposed on opposite sides of the fifth surface, and the first bonding leads on the fifth surface are electrically connected to the first bonding pins on the first surface, and the second bonding leads on the fifth surface are electrically connected to the second bonding pins on the third surface.

17. The annular display device of claim 12, wherein
    the first flexible substrate comprises a first surface and a second surface opposite to each other, and the first surface faces the virtual center point of the annular display device, and a plurality of first bonding pins are disposed on the first surface;
    the second flexible substrate comprises a third surface and a fourth surface opposite to each other, and the third surface faces the virtual center point of the annular display device, and a plurality of second bonding pins are disposed on the third surface; and
    the flexible circuit board comprises a fifth surface and a sixth surface opposite to each other, and the sixth surface faces the virtual center point of the annular display device, and a plurality of first bonding leads and second bonding leads are respectively disposed on opposite sides of the fifth surface, and the first bonding leads on the fifth surface are electrically connected to the first bonding pins on the first surface, and the second bonding leads on the fifth surface are electrically connected to the second bonding pins on the third surface.

18. The annular display device of claim 13, wherein
the first flexible substrate comprises a first surface and a second surface opposite to each other, and the first surface faces the virtual center point of the annular display device, and a plurality of first bonding pins are disposed on the first surface;
the second flexible substrate comprises a third surface and a fourth surface opposite to each other, and the third surface faces the virtual center point of the annular display device, and a plurality of second bonding pins are disposed on the fourth surface; and
the flexible circuit board comprises a fifth surface and a sixth surface opposite to each other, and the sixth surface faces the virtual center point of the annular display device, and a plurality of first bonding leads and second bonding leads are respectively disposed the fifth surface and the sixth surface, and the first bonding leads on the fifth surface are electrically connected to the first bonding pins on the first surface, and the second bonding leads on the sixth surface are electrically connected to the second bonding pins on the fourth surface.

* * * * *